(12) United States Patent
Sahin

(10) Patent No.: US 12,003,436 B2
(45) Date of Patent: Jun. 4, 2024

(54) METHODS AND SYSTEMS FOR ENCODING AND DECODING BASED ON PARTITIONED COMPLEMENTARY SEQUENCES

(71) Applicant: University of South Carolina, Columbia, SC (US)

(72) Inventor: Alphan Sahin, Columbia, SC (US)

(73) Assignee: UNIVERSITY OF SOUTH CAROLINA, Columbia, SC (US)

( * ) Notice: Subject to any disclaimer, the term of this patent is extended or adjusted under 35 U.S.C. 154(b) by 263 days.

(21) Appl. No.: 17/562,265

(22) Filed: Dec. 27, 2021

(65) Prior Publication Data
US 2022/0216960 A1 Jul. 7, 2022

Related U.S. Application Data

(60) Provisional application No. 63/131,383, filed on Dec. 29, 2020.

(51) Int. Cl.
*H04L 5/00* (2006.01)

(52) U.S. Cl.
CPC .......... *H04L 5/0035* (2013.01); *H04L 5/0007* (2013.01); *H04L 5/0098* (2013.01)

(58) Field of Classification Search
None
See application file for complete search history.

(56) References Cited

U.S. PATENT DOCUMENTS

| | | | | |
|---|---|---|---|---|
| 11,515,959 B2 * | 11/2022 | Lopez | ...... | H04J 13/12 |
| 2006/0104373 A1 * | 5/2006 | Bar-Ness | ...... | H04L 27/2617 375/260 |
| 2010/0091900 A1 * | 4/2010 | Gan | ...... | H04L 27/2614 375/267 |
| 2011/0090972 A1 * | 4/2011 | Jong-Seon | ...... | H04L 27/2621 375/341 |
| 2013/0315169 A1 * | 11/2013 | Porat | ...... | H04B 7/0413 370/329 |

(Continued)

FOREIGN PATENT DOCUMENTS

EP 1676407 A1 * 7/2006 ............. H04L 27/26

OTHER PUBLICATIONS

C. Chen and S. Wu, "Golay complementary sequence sets with large zero correlation zones," IEEE Trans. Commun., Jul. 2018, pp. 5197-5204, vol. 66, No. 11.

(Continued)

*Primary Examiner* — Anh Vu H Ly
(74) *Attorney, Agent, or Firm* — BURR & FORMAN LLP

(57) ABSTRACT

A method includes generating, by processing circuitry of a communications device, a partitioned complementary sequence based on information bits for transmission. The partitioned complementary sequence may include zero-valued elements. The method may include encoding a plurality of symbols on a plurality of orthogonal subcarriers using the partitioned complementary sequence. The encoding may include mapping additional information bits on subcarriers associated with the zero-valued elements of the partitioned complementary sequence. Additionally, the method may include controlling a radio of the communications device to transmit the plurality of symbols on the plurality of orthogonal subcarriers via an antenna of the communications device.

20 Claims, 21 Drawing Sheets

(56) References Cited

U.S. PATENT DOCUMENTS

| | | | | |
|---|---|---|---|---|
| 2014/0362934 | A1* | 12/2014 | Kumar | H04L 27/2615 375/295 |
| 2019/0363825 | A1* | 11/2019 | Radosevic | H03M 13/616 |
| 2021/0105079 | A1* | 4/2021 | Lei | H04J 13/0003 |

OTHER PUBLICATIONS

D. Lehmer, "Teaching combinatorial tricks to a computer," Proc. Sympos. Appl. Math. Combinatorial Analysis Amer. Math. Soc., 1960, pp. 179-193, vol. 10.

G. E. Andrews and J. A. Sellers, "On Sloane's generalization of nonsquashing stacks of boxes," Discrete Mathematics, May 2006, pp. 1185-1190, vol. 307, No. 9.

"16-QAM Golay Complementary Sequence Sets with Arbitrary Lengths"; Fanxin Zeng, Xiaoping Zeng, Zhenyu Zhang and Guixin Xuan; IEEE Communications Letters, vol. 17, No. 6, Jun. 2013.

L. H. Sun and M. Zhang, "On the enumeration and congruences for m-ary partitions," Journal of Number Theory, Apr. 2018, pp. 423-433, vol. 185.

A. Sahin and R. Yang, "A generic complementary sequence construction and associated encoder/decoder design," IEEE Trans. Commun., Oct. 2020, pp. 1-15, vol. (under review).

A. Sahin and R. Yang, "An uplink control channel design with complementary sequences for unlicensed bands," IEEE Trans. Wireless Commun., Jul. 2020, pp. 6858-6870, vol. 19, No. 10.

F. Yarkin and J.P. Coon, "Set partition modulation," IEEE Trans. Wireless Commun., Nov. 2020, pp. 7557-7570, vol. 19, No. 11.

A. Sahin and D. W. Matolak, "Golay layer: Limiting peak-to-average power ratio for OFDM-based autoencoders," Proc. IEEE International Conference on Communications (ICC), Jun. 2020, pp. 1-7.

F. Yarkin and J. P. Coon, "Composition modulation," Jun. 2020, pp. 1-5.

F. Yarkin and J.P. Coon, "Index and composition modulation," Sep. 2020, pp. 1-6.

N. Sloane and J. A. Sellers, "On non-squashing partitions," Discrete Mathematics, May 2005, pp. 259-274, vol. 295, No. 3.

Y. Li, "A construction of general QAM Golay complementary sequences," IEEE Trans. Inf. Theory, Nov. 2010, pp. 5765-5771, vol. 56, No. 11.

C. Robing and V. Tarokh, "A construction of OFDM 16-QAM sequences having low peak powers," IEEE Trans. Inf. Theory, Jul. 2001, pp. 2091-2094, vol. 47, No. 5.

C. V. Chong, R. Venkataramani, and V. Tarokh, "A new construction of 16-QAM Golay complementary sequences," IEEE Trans. Inf. Theory, Nov. 2003, pp. 2953-2959, vol. 49, No. 11.

H. Lee and S. W. Golomb, "A new construction of 64-QAM Golay complementary sequences," IEEE Trans. Inf. Theory, Apr. 2006, pp. 1663-1670, vol. 52, No. 4.

J. P. Coon, M. Badiu, Y. Liu, F. Yarkin, and S. Dang, "Binary-tree encoding for uniform binary sources in index modulation systems," IEEE J. Sel. Topics Signal Process., May 2019, pp. 1270-1285, vol. 13, No. 6.

Y. Li, "Comments on "a new construction of 16-QAM Golay complementary sequences" and extension for 64-QAM Golay sequences," IEEE Trans. Inf. Theory, Jul. 2008, pp. 3246-3251, vol. 54, No. 7.

M. Golay, "Complementary series", IRE Trans. Inf. Theory, Apr. 1961, pp. 82-87, vol. 7, No. 2.

T. Mao, Z. Wang, Q. Wang, S. Chen, and L. Hanzo, "Dual-mode index modulation aided OFDM," IEEE Access, Aug. 2017, pp. 50-60, vol. 5.

A. Folsom, Y. Homma, J. H. Ryu, and B. Tong, "On a general class of non-squashing partitions," Discrete Mathematics, May 2016, pp. 1482-1506, vol. 339, No. 5.

] K. G. Peterson, "Generalized Reed-Muller codes and power control in OFDM modulation," IEEE Trans. Inf. Theory, Jan. 2000, pp. 104-120, vol. 46, No. 1.

S. Hoque, C.-Y.Chen, and A. Sahin,"A wideband index modulation with circularly-shifted chirps," Proc. IEEE Consumer Commun. & Netw. Conf. (CCNC), Jan. 2021, pp. 1-6.

A. Vora and K. Kang, "Index modulation with PAPR and beamforming for 5G MIMO-OFDM," IEEE 5G World Forum (5GWF), Jul. 2018, pp. 389-394.

A. Jaradat, J.M. Hamamreh, and H. Arslan, "Orthogonal frequency division multiplexing with subcarrier gap modulation," Proc. IEEE International Symposium on Personal, Indoor and Mobile Radio Communications (PIMRC), Aug. 2020, pp. 1-6.

M. Wen, E. Basar, Q. Li, B. Zheng, and M. Zhang, "Multiple-mode orthogonal frequency division multiplexing with index modulation," IEEE Trans. Commun., May 2017, pp. 3892-3906, vol. 65, No. 9.

M. Nakao and S. Sugiura, "Dual-mode time-domain single-carrier index modulation with frequency-domain equalization," 2017 IEEE 86th Vehicular Technology Conference (VTC-Fall), 2017, pp. 1-5.

C. Chang, Y. Li, and J. Hirata, "New 64-QAM Golay complementary sequences," IEEE Trans. Inf. Theory, May 2010, pp. 2479-2485, vol. 56, No. 5.

S. Das, U. Parampalli, S. Majhi, Z. Liu, and S. Budisin, "New optimal Z-complementary code sets based on generalized paraunitary matrices," IEEE Trans. Signal Process., 2020, pp. 5546-5558, vol. 68.

E. Basar, U. Aygolu, E. Panayirci, and H.V. Poor, "Orthogonal frequency division multiplexing with index modulation," IEEE Trans. Signal Process., Aug. 2013, pp. 5536-5549, vol. 61, No. 22.

J. Hirschhorn and J. Sellers, "A different view of m-ary partitions," Australasian Journal of Combinatorics, 2004, pp. 196-195, vol. 30.

K. Kim, "PAPR reduction in OFDM-IM using multilevel dither signals," IEEE Commun. Lett. Jan. 2019, vol. 23, No. 2.

S. Z. Budisin and P. Spasojevi' C, "Paraunitary-based Boolean generator for QAM complementary sequences of length 2K," IEEE Trans. Inf. Theory, Aug. 2018, pp. 5938-5956, vol. 64, No. 8.

J. Zheng and H. Lv, "Peak-to-average power ratio reduction in ofdm index modulation through convex programming," IEEE Commun. Lett., Apr. 2017, pp. 1505-1508, vol. 21, No. 7.

Y. Rahmatallah and S. Mohan, "Peak-to-average power ratio reduction in OFDM systems: A survey and taxonomy," IEEE Commun. Surveys Tut., Fourth 2013, pp. 1567-1592, vol. 15, No. 4.

J. A. Davis and J. Jedwab, "Peak-to-mean power control in OFDM, Golay complementary sequences, and Reed-Muller codes," IEEE Trans. Inf. Theory, Nov. 1999, pp. 2397-2417, vol. 45, No. 7.

F. Yarkin and J.P. Coon, "Q-ary multi-mode OFDM with index modulation," IEEE Trans. Wireless Commun. Lett., Jul. 2020, pp. 1110-1114, vol. 9, No. 7.

S. Sugiura, T. Ishihara, and M. Nakao, "State-of-the-art design of index modulation in the space, time, and frequency domains: Benefits and fundamental limitations," IEEE Access, Oct. 2017, pp. 21 774-21 790, vol. 5.

Y. Li and Y.-C. Kao, "Structures of non-GDJ golay sequences," Proc. International Symposium on Information Theory (ISIT), Sep. 2005, pp. 378-381.

B. M. Popovic, "Synthesis of power efficient multitone signals with flat amplitude spectrum," IEEE Trans. Commun., Jul. 1991, pp. 1031-1033, vol. 39, No. 7.

C. V. Chong and V. Tarokh, "Two constructions of 16-QAM Golay complementary sequences," IEEE International Symposium on Information Theory (ISIT), Jun. 2002, p. 240.

G. Ungerboeck, "Channel coding with multilevel/phase signals," IEEE Trans. Inf. Theory, Jan. 1982, pp. 55-67, vol. 28, No. 1.

D. Slepian, "Permutation modulation," Proceedings of the IEEE, Mar. 1965, pp. 228-236, vol. 53, No. 3.

Sahin, X. Wang, H. Lou, and R. Yang, "Low-PAPR multi-channel OOK waveform for IEEE 802.11ba Wake-Up Radio," 2019 IEEE Global Communication Conference (GLOBECOM), Dec. 2019, pp. 1-6.

Sahin, "Encoding and Decoding with Partitioned Complementary Sequences for Low-PAPR OFDM," IEEE Transactions on Wireless Communications, Sep. 24, 2021.

(56) References Cited

OTHER PUBLICATIONS

G. Wunder, R.F.H. Fischer, H. Boche, S. Litsyn, and J. No, "The PAPR problem in OFDM transmission; New directions for a long-lasting problem," IEEE Signal Processing Magazine, Nov. 2013, pp. 130-144, vol. 30, No. 6.

\* cited by examiner (a) The total number of bits encoded with non-zero elements and partitions.

(b) The total number of bits encoded with partitions.

(c) The total number of bits encoded with non-zero elements.

(d) Spectral efficiency for different $m$.

(a) Minimum distance versus SE.

(b) Minimum distance for given bandwidth and a range of SE.

(a) AWGN channel, no minimum distance contraint.

(b) Fading channel, no minimum distance constraint.

(c) AWGN channel, under a minimum distance contraint.

(d) Fading channel, under a minimum distance contraint.

← 900

Algorithm 1: ML-based recursive decoder for partitioned CSs $\textbf{Function}\ (b_{\text{phase}}, b_{\pi,\text{part}}) = \text{main}\ ((c_x)_{x=0}^{M-1}, (r_x)_{x=0}^{M-1}, m, H, Z, l)$
    $w_x \leftarrow c_x^* r_x$ and $h_x \leftarrow |c_x|^2/2$
    Populate $W_m, q_m,$ and $l_m$ for different $s$ and $\pi_1$
    Run $(\hat{n}_m, \pi, k_1, \ldots, k_m, k') = \text{dec}(W_m, q_m, l_m)$
    Obtain $s$ based on $\hat{n}_m$
    $i_\pi \leftarrow \text{perm2int}(\pi)$
    $i_{\text{part}} \leftarrow \delta_3(s, Z, m, l) - 1$
    $i_{\pi,\text{part}} \leftarrow i_{\text{part}} m!/2 + i_\pi$
    Calculate $b_{\text{phase}}$ from $(k_1, \ldots, k_m, k')$
    Calculate $b_{\pi,\text{part}}$ from $i_{\pi,\text{part}}$ $\textbf{Function}\ (\hat{n}_m, \pi, k_1, \ldots, k_m, k') = \text{dec}(W_m, q_m, l_m)$
    Enumerate $W_{m-1}, q_{m-1}, l_{m-1}$ based on Section IV-B1
    if $m = 1$ then
        $\hat{n}_m \leftarrow$ The index of the sequence in $W_{m-1}$ that maximizes (19)
        $k', k_1 \leftarrow$ ML detection for $\hat{n}_m$th sequence
        $\pi \leftarrow (1)$
    else
        Prune $W_{m-1}, q_{m-1}, l_{m-1}$ based on Section IV-B1
        Store the indices of the best sequences in $n_{m-1}$
        $(i, \pi', k_2, \ldots, k_m, k') = \text{dec}(W_{m-1}, q_{m-1}, l_{m-1})$
        $\hat{n}_{m-1} \leftarrow$ the $i$th element of $n_{m-1}$
        $\hat{n}_m \leftarrow \lfloor \hat{n}_{m-1}/((m-1)H) \rfloor$
        $\pi_1 \leftarrow$ the $\hat{n}_m$th element of $l_{m-1}$
        $(\pi_2, \ldots, \pi_m) \leftarrow (1, \ldots, \pi_1 - 1, \pi_1 + 1, \ldots, m)_{\pi'}$
        $k_1 \leftarrow \text{mod}(\hat{n}_m, H)$

Algorithm 2: A recursive decoder for the partitioned CSs

Function $(b_{\text{non-zero}}, b_{\pi,\text{supp}}) = \text{main}\,((c_i)_{i=0}^{M-1}, (r_i)_{i=0}^{M-1}, m, H, Z, l)$
  Calculate $w_i \leftarrow c_i^* r_i$ and $h_i \leftarrow |c_i|^2/2$
  Populate $W_m$, $q_m$, and $l_m$ for different $s$ and $\pi_1$
  Run $(\hat{n}_m, \hat{\pi}, \hat{k}_1, \ldots, \hat{k}_m, \hat{k}') = \text{dec}(W_m, q_m, l_m)$
  Obtain $s$ based on $\hat{n}_m$
  Calculate $i_\pi$ from $\hat{\pi}$ (permutation to integer)
  Calculate $i_{\text{supp}} = \epsilon_3^{-1}(s, Z, m, l) - 1$
  Calculate $i_{\pi,\text{supp}} = i_{\text{supp}} m!/2 + i_\pi$
  Calculate $b_{\text{non-zero}}$ from $(\hat{k}_1, \ldots, \hat{k}_m, \hat{k}')$
  Calculate $b_{\pi,\text{supp}}$ from $i_{\pi,\text{supp}}$

Function $(\hat{n}_m, \hat{\pi}, \hat{k}_1, \ldots, \hat{k}_m, \hat{k}') = \text{dec}(W_m, q_m, l_m)$
  Enumerate $W_{m-1}, q_{m-1}$, and $l_{m-1}$
  if $m = 1$ then
    Set $\hat{n}_m$ as the index of the best sequence in $W_{m-1}$
    Obtain $\hat{k}'$ and $\hat{k}_1$ based on ML detection for $\hat{n}_m$th sequence
    Set $\hat{\pi} = (1)$
  else
    Prune $W_{m-1}, q_{m-1}, l_{m-1}$
    Populate the indices of the chosen sequences in $n_{m-1}$
    Run $(i, \pi', \hat{k}_2, \ldots, \hat{k}_m, \hat{k}') = \text{dec}(W_{m-1}, q_{m-1}, l_{m-1})$
    Calculate $\hat{n}_{m-1}$ as the $i$th element of $n_{m-1}$
    Calculate $\hat{n}_m$ from $\hat{n}_{m-1}$ (based on the enumeration order)
    Calculate $\hat{\pi}_1$ as the $\hat{n}_m$th element of $l_{m-1}$
    Set $(\hat{\pi}_2, \ldots, \hat{\pi}_m)$ as $(1, \ldots, \hat{\pi}_1 - 1, \hat{\pi}_1 + 1, \ldots, m)_{\pi'}$
    Calculate $\hat{k}_1$ from $\hat{n}_m$ (based on the enumeration order)

FIG. 12

METHODS AND SYSTEMS FOR ENCODING AND DECODING BASED ON PARTITIONED COMPLEMENTARY SEQUENCES

CROSS-REFERENCE TO RELATED APPLICATION

This patent application claims priority to U.S. provisional application 63/131,383, filed on Dec. 29, 2020, entitled METHODS AND SYSTEMS FOR ENCODING AND DECODING BASED ON PARTITIONED COMPLEMENTARY SEQUENCES, the entire contents of which are hereby incorporated by reference in their entirety.

TECHNICAL FIELD

The subject matter disclosed herein is generally directed to communications technologies and more specifically to encoding and decoding techniques.

BACKGROUND

High peak-to-average-power ratio (PAPR) is a long-lasting problem of an orthogonal frequency division multiplexing (OFDM) transmission. Among many other PAPR mitigation methods, see G. Wunder, R. F. H. Fischer, H. Boche, S. Litsyn, and J. No, "The PAPR problem in OFDM transmission: New directions for a long-lasting problem," *IEEE Signal Processing Magazine*, vol. 30, no. 6, pp. 130-144, November 2013 and Y. Rahmatallah and S. Mohan, "Peak-to-average power ratio reduction in OFDM systems: A survey and taxonomy," *IEEE Commun. Surveys Tut.*, vol. 15, no. 4, pp. 1567-1592, Fourth 2013., complementary sequences (CSs), introduced by Marcel Golay, allow one to limit the peak instantaneous, see M. Golay, "Complementary series," *IRE Trans. Inf. Theory*, vol. 7, no. 2, pp. 82-87, April 1961, power of OFDM signals without any optimization method, see also B. M. Popovic, "Synthesis of power efficient multitone signals with flat amplitude spectrum," *IEEE Trans. Commun.*, vol. 39, no. 7, pp. 1031-1033, July 1991. In J. A. Davis and J. Jedwab, "Peak-to-mean power control in OFDM, Golay complementary sequences, and Reed-Muller codes," *IEEE Trans. Inf. Theory*, vol. 45, no. 7, pp. 2397-2417, November 1999. Davis and Jedwab showed that $m!/2 \cdot 2^{h(m+1)}$ CSs of length $2^m$ for $h \in \mathbb{Z}^+$ occur as the elements of the cosets of the first-order Reed-Muller (RM) code within the second-order RM code. Hence, they obtained a notable coding scheme guaranteeing a low PAPR for OFDM symbols while providing good error correction capability. The set of CSs based on Davis and Jedwab's construction is often referred to as Golay-Davis-Jedwab (GDJ) sequences or standard CSs.

One drawback of the code proposed by Davis and Jedwab is the low spectral efficiency (SE). To address this issue, one direction is to obtain CSs that cannot be generated through the method in Davis and Jedwab, i.e., non-standard sequences. In Y. Li and Y.-C. Kao, "Structures of non-GDJ golay sequences," in *Proc. International Symposium on Information Theory (ISIT)*, September 2005, pp. 378-381, it was shown that some Boolean functions containing third-order monomials can lead to CSs. Another direction is to synthesize CSs where their elements belong to a larger alphabet such as quadrature amplitude modulation (QAM) constellation. Li showed that there exist at least $[(m+1)4^{2(q-1)} - (m+1)4^{(q-1)} + 2^{q-1}](m!/2)4^{(m+1)}$ CSs with $4^q$-QAM alphabet, see Y. Li, "A construction of general QAM Golay complementary sequences," *IEEE Trans. Inf. Theory*, vol. 56, no. 11, pp. 5765-5771, November 2010., which generalizes the results in earlier work in, C. RöBing and V. Tarokh, "A construction of OFDM 16-QAM sequences having low peak powers," *IEEE Trans. Inf. Theory*, vol. 47, no. 5, pp. 2091-2094, July 2001, C. V. Chong and V. Tarokh, "Two constructions of 16-QAM Golay complementary sequences," in *Proc. IEEE International Symposium on Information Theory (ISIT)*, June 2002, p. 240, C. V. Chong, R. Venkataramani, and V. Tarokh, "A new construction of 16-QAM Golay complementary sequences," *IEEE Trans. Inf. Theory*, vol. 49, no. 11, pp. 2953-2959, November 2003, H. Lee and S. W. Golomb, "A new construction of 64-QAM Golay complementary sequences," *IEEE Trans. Inf. Theory*, vol. 52, no. 4, pp. 1663-1670, April 2006, C. Chang, Y. Li, and J. Hirata, "New 64-QAM Golay complementary sequences," *IEEE Trans. Inf. Theory*, vol. 56, no. 5, pp. 2479-2485, May 2010, and Y. Li, "Comments on "a new construction of 16-QAM Golay complementary sequences" and extension for 64-QAM Golay sequences," *IEEE Trans. Inf. Theory*, vol. 54, no. 7, pp. 3246-3251, July 2008, by using a method called offset method. In S. Z. Budišin and P. Spasojevi'c, "Paraunitary-based Boolean generator for QAM complementary sequences of length 2K," *IEEE Trans. Inf. Theory*, vol. 64, no. 8, pp. 5938-5956, August 2018., QAM CSs were synthesized by indexing the elements of the unitary matrices and using the properties of Gaussian integers. Another approach that has recently attracted significant interest is to construct complementary sequence sets or complete complementary code as discussed in C. Chen and S. Wu, "Golay complementary sequence sets with large zero correlation zones," *IEEE Trans. Commun.*, vol. 66, no. 11, pp. 5197-5204, July 2018 and S. Das, U. Parampalli, S. Majhi, Z. Liu, and S. Budišin, "New optimal Z-complementary code sets based on generalized paraunitary matrices," *IEEE Trans. Signal Process.*, vol. 68, pp. 5546-5558, 2020. and the references therein, which relax the maximum peak instantaneous power of CSs, but beneficial for obtaining many sequences with large zero-correlation zones.

Although the aforementioned constructions are remarkable, they are not as concise as the one in Davis and Jedwab. They often do not reveal the encoding and decoding procedures for a practical system. In A., Sahin and R. Yang, "A generic complementary sequence construction and associated encoder/decoder design," *IEEE Trans. Commun.*, vol. (under review), pp. 1-15, October 2020, a CS construction based on separate polynomials for the magnitude and phase of the elements of synthesized CS, the support, and the seed Golay complementary pair (GCP) was proposed. Since this construction generalizes Davis and Jedwab's method through independently configurable polynomials, it allows one to develop encoder and decoder for CSs while enabling CS with zero-valued elements and CS with uniform and non-uniform constellations, systematically. This construction was exploited for developing neural network (NN)-based encoding and decoding, see A., Sahin and D. W. Matolak, "Golay layer: Limiting peak-to-average power ratio for OFDM-based autoencoders," in *Proc. IEEE International Conference on Communications (ICC)*, June 2020, pp. 1-7, for OFDM-based autoencoder (OFDM-AE) and a low-PAPR multi-user scheme in the uplink for the interlaced allocation in 3GPP Fifth Generation (5G) NR operation in unlicensed bands (NR-U), see A. Sahin and R. Yang, "An uplink control channel design with complementary sequences for unlicensed bands," *IEEE Trans. Wireless Commun.*, vol. 19, no. 10, pp. 6858-6870, July 2020.

Developing a low-PAPR encoder based on CSs is not a straightforward task since a set of different CSs is typically constrained in terms of size, sequence length, and alphabet. For example, CSs with a high-order modulation can alter the mean OFDM symbol power and cause a PAPR larger than 3 dB when the entire transmission is considered for the average power calculation. Although it is possible to address this issue by constraining the magnitude of the elements of CSs as done by Sahin and Yang, this issue increases the design complexity and decreases the number of different CSs. The performance of CSs with a high-order modulation can also be worse than the one for CSs with a phase shift keying (PSK) alphabet, e.g., standard sequences, since a high-order modulation often decreases the minimum Euclidean distance of the set of CSs. It is also challenging to enumerate CSs with arbitrary length. For example, if the degrees-of-freedom (DoF) is different from a typical CS length, i.e., $2^m$, the available DoF is not fully exploited to increase the data rate or reduce the error rate. The current disclosure seeks to address these problems.

Citation or identification of any document in this application is not an admission that such a document is available as prior art to the present disclosure.

SUMMARY

According to some example embodiments, an apparatus is provided that may be a communications device. The apparatus may comprise an antenna, a radio, and processing circuitry. The radio may be configured to transmit and receive wireless communications via the antenna. The processing circuity may be configured to control the radio to establish a wireless communications link with a receiving communications device. The processing circuitry may be further configured to generate a partitioned complementary sequence based on information bits for transmission. The partitioned complementary sequence may comprise zero-valued elements. Further, the processing circuitry may be configured to encode a plurality of symbols on a plurality of orthogonal subcarriers using the partitioned complementary sequence. In this regard, the processing circuitry may be configured to map additional information bits for encoding on subcarriers associated with the zero-valued elements of the partitioned complementary sequence. The processing circuitry may also be configured to control the radio to transmit the plurality of symbols on the plurality of orthogonal subcarriers via the antenna.

An example method is also provided according to some example embodiments. In this regard, the example method may comprise generating, by processing circuitry of a communications device, a partitioned complementary sequence based on information bits for transmission. The partitioned complementary sequence may comprise zero-valued elements. The example method may also comprise encoding a plurality of symbols on a plurality of orthogonal subcarriers using the partitioned complementary sequence. In this regard, the encoding may comprise mapping additional information bits on subcarriers associated with the zero-valued elements of the partitioned complementary sequence. Additionally, the example method may comprise controlling a radio of the communications device to transmit the plurality of symbols on the plurality of orthogonal subcarriers via an antenna of the communications device.

The above objectives are accomplished according to in accordance with some of the example embodiments by providing in a first embodiment, methods for forming partitioned complementary sequences (CSs) where the gaps between the clusters encode information bits to achieve low peak-to-average-power ratio (PAPR) coded orthogonal frequency division multiplexing (OFDM) symbols, partitioning can increase the spectral efficiency (SE) without changing the alphabet of the non-zero elements of the CS as shown and described herein.

In a further embodiment, systems are provided for forming partitioned complementary sequences (CSs) where the gaps between the clusters encode information bits to achieve low peak-to-average-power ratio (PAPR) coded orthogonal frequency division multiplexing (OFDM) symbols, partitioning can increase the spectral efficiency (SE) without changing the alphabet of the non-zero elements of the CS as shown and described herein.

In a still further embodiment, an encoder for partitioned CSs and a maximum-likelihood (ML)-based recursive decoder for additive white Gaussian noise (AWGN) and fading channels are provided, wherein the partitioned CSs under a minimum distance constraint can perform similar to the standard CSs in terms of error rate while providing a higher SE at the expense of a limited Eb/N0 loss as shown and described herein.

These and other aspects, objects, features, and advantages of the example embodiments will become apparent to those having ordinary skill in the art upon consideration of the following detailed description of example embodiments.

BRIEF DESCRIPTION OF THE DRAWINGS

An understanding of the features and advantages of the present disclosure will be obtained by reference to the following detailed description that sets forth illustrative embodiments, in which the principles of the disclosure may be utilized, and the accompanying drawings of which:

FIG. 9 shows Algorithm 1 and an maximum likelihood-based recursive decoder for partitioned complementary sequences according to some example embodiments;

FIG. 12 shows an example algorithm that describes the function of a recursive decoder according to some example embodiments.

Figure 1:
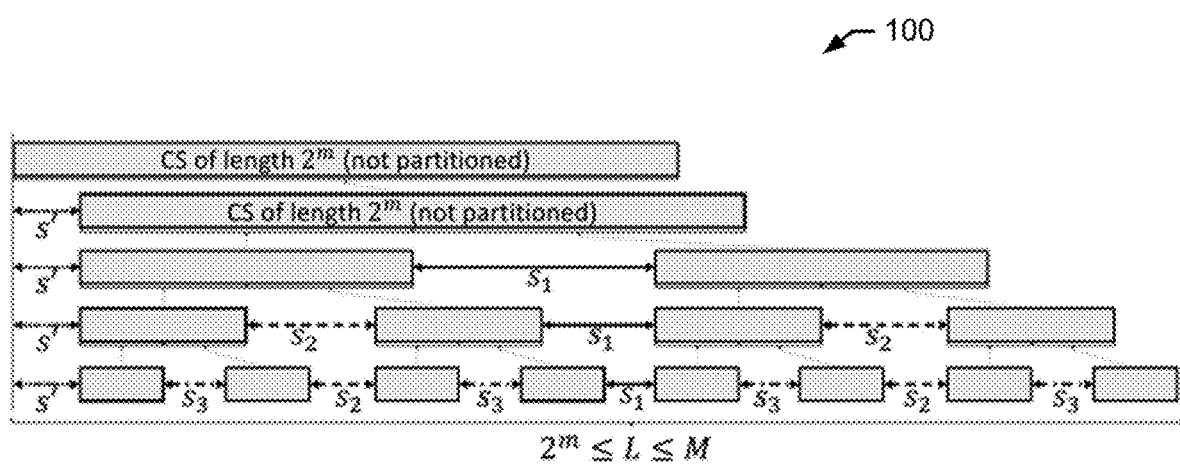
FIG. 1 shows a complementary sequence partitioning process where the complementary sequence changes based on the values of s' and $s_n$ for n={1; 2; 3}, where the number of zero-valued elements is $s'+s_1+2s_2+4s_3$ according to some example embodiments.

The figures herein are for illustrative purposes only and are not necessarily drawn to scale.

DETAILED DESCRIPTION OF THE EXAMPLE EMBODIMENTS

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting.

Unless specifically stated, terms and phrases used in this document, and variations thereof, unless otherwise expressly stated, should be construed as open ended as opposed to limiting. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise.

Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are cited to disclose and describe the methods and/or materials in connection with which the publications are cited. All such publications and patents are herein incorporated by this reference as if each individual publication or patent were specifically and individually indicated to be incorporated by reference. Such incorporation by reference is expressly limited to the methods and/or materials described in the cited publications and patents and does not extend to any lexicographical definitions from the cited publications and patents. Any lexicographical definition in the publications and patents cited that is not also expressly repeated in the instant application should not be treated as such and should not be read as defining any terms appearing in the accompanying claims. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Where a range is expressed, a further embodiment includes from the one particular value and/or to the other particular value. The recitation of numerical ranges by endpoints includes all numbers and fractions subsumed within the respective ranges, as well as the recited endpoints. Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, "about," "approximately," "substantially," and the like, when used in connection with a measurable variable such as a parameter, an amount, a temporal duration, and the like, are meant to encompass variations of and from the specified value including those within experimental error (which can be determined by e.g. given data set, art accepted standard, and/or with e.g. a given confidence interval (e.g. 90%, 95%, or more confidence interval from the mean), such as variations of +/−10% or less, +/−5% or less, +/−1% or less, and +/−0.1% or less of and from the specified value, insofar such variations are appropriate to perform in the disclosure. As used herein, the terms "about," "approximate," "at or about," and "substantially" can mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

The term "optional" or "optionally" means that the subsequent described event, circumstance or substituent may or may not occur, and that the description includes instances where the event or circumstance occurs and instances where it does not.

As used interchangeably herein, the terms "sufficient" and "effective," can refer to an amount (e.g. mass, volume, dosage, concentration, and/or time period) needed to achieve one or more desired and/or stated result(s). For example, a therapeutically effective amount refers to an amount needed to achieve one or more therapeutic effects.

Various embodiments are described hereinafter. It should be noted that the specific embodiments are not intended as an exhaustive description or as a limitation to the broader aspects discussed herein. One aspect described in conjunction with a particular embodiment is not necessarily limited to that embodiment and can be practiced with any other embodiment(s). Reference throughout this specification to "one embodiment", "an embodiment," "an example embodiment," means that a particular feature, structure or characteristic described in connection with the embodiment is included in at least one embodiment of the present disclosure. Thus, appearances of the phrases "in one embodiment," "in an embodiment," or "an example embodiment" in various places throughout this specification are not necessarily all referring to the same embodiment, but may. Furthermore, the particular features, structures or characteristics may be combined in any suitable manner, as would be apparent to a person skilled in the art from this disclosure, in one or more embodiments. Furthermore, while some embodiments described herein include some but not other features included in other embodiments, combinations of features of different embodiments are meant to be within the scope of the disclosure. For example, in the appended claims, any of the claimed embodiments can be used in any combination.

All patents, patent applications, published applications, and publications, databases, websites and other published materials cited herein are hereby incorporated by reference to the same extent as though each individual publication, published patent document, or patent application was specifically and individually indicated as being incorporated by reference.

Example embodiments relate to wireless communications technology that leverages the use of complementary sequences (CSs) in the context of coding. The use of CSs for coding in, for example, an orthogonal frequency division multiplexing (OFDM) context, can operate to cap the peak-to-mean envelop power ratio (PMEPR). This aspect of CSs implemented in OFDM contexts can facilitate the generation of tightly-bounded OFDM signals that support simplified amplifier specifications for OFDM transmitters. A related publication authored by Alphan Sahin discusses some of these concepts—A. Sahin, "Encoding and Decoding with Partitioned Complementary Sequences for Low-PAPR OFDM," in *IEEE Transactions on Wireless Communications*, doi: 10.1109/TWC.2021.3113589, published 24 Sep. 2021—is incorporated by reference in its entirety.

Accordingly, some example embodiments leverage the use of partitioned complementary sequences (CSs) where the gaps between the clusters encode information bits to achieve low peak-to-average-power ratio (PAPR) coded orthogonal frequency division multiplexing (OFDM) symbols. Further, some example embodiments perform partitioning to increase the spectral efficiency (SE) without changing the alphabet of the non-zero elements of the CS, i.e., standard CSs relying on Reed-Muller (RM) code, as well as an encoder for partitioned CSs and a maximum-likelihood (ML)-based recursive decoder for additive white Gaussian noise (AWGN) and fading channels. The partitioned CSs under a minimum distance constraint can perform similar to the standard CSs in terms of error rate while providing a higher SE at the expense of a limited Eb/N0 loss.

According to some example embodiments, improvements in communications technology may be realized by, for example, partitioning the standard CSs based on the information bits by using a framework CSs with zero-valued elements. Such CSs may have been primarily utilized for addressing resource allocation in an OFDM symbol as in A., Sahin and R. Yang, "An uplink control channel design with complementary sequences for unlicensed bands," *IEEE Trans. Wireless Commun.*, vol. 19, no. 10, pp. 6858-6870, July 2020 and A., Sahin, X. Wang, H. Lou, and R. Yang, "Low-PAPR multi-channel OOK waveform for IEEE 802.11ba Wake-Up Radio," in 2019 *IEEE Global Communications Conference (GLOBECOM)*, December 2019, pp. 1-6, which is incorporated herein in its entirety. According to some example embodiments, zero-valued elements of a CS for extra information transmission and its systematic design to address the issue of high PAPR of OFDM symbols are provided herein. Accordingly, it is an object of some example embodiments to address the high PAPR problem of a coded OFDM transmission (i.e., the waveform utilized in 4G, 5G, and Wi-Fi).

Complementary sequences (CSs) have can be utilized for IEEE 802.11ad/ay (Wi-Fi at 60 GHz millimeter wave band) for channel estimation or beam training sequences. These sequences can lower the peak-to-average-power ratio (PAPR) of an orthogonal frequency division multiplexing (OFDM) transmission and can be useful for increasing link distance and reliability of the communication. Nevertheless, encoding and decoding with these CSs can be challenging as it can be difficult to generate many CSs. According to some example embodiments, partitioned complementary sequences (CSs) can be utilized where the gaps between the clusters encode information bits to achieve low peak-to-average-power ratio (PAPR) coded symbols. The partitioning rule may be implemented without losing the feature of being a CS and may coincide with the non-squashing partitions of a positive integer, which can lead to a symmetric separation of clusters. The number of partitioned CSs may be analytically derived for a given bandwidth and a minimum distance constraint. The corresponding recursive methods may be obtained for enumerating partitions. Partitioning can increase the spectral efficiency (SE) without changing the alphabet of the non-zero elements of the CS, i.e., standard CSs relying on Reed-Muller (RM) code. An encoder for partitioned CSs can be implemented and a maximum-likelihood (ML)-based recursive decoder for additive white Gaussian noise (AWGN) and fading channels can be realized.

The partitioned CSs under a minimum distance constraint can perform similar to the standard CSs in terms of error rate while providing a higher SE at the expense of a limited Eb/N0 loss. Orthogonal frequency division multiplexing (OFDM) waveform utilized in 4G, 5G, and Wi-Fi has peaky signal characteristics. Hence, the waveform is often distorted under a non-linear power amplifier of a practical radio. To avoid this distortion, either the transmit power can be reduced, i.e., a shorter communication range, or an expensive power amplifier can be employed at the radio to handle the large instantaneous peak power of OFDM transmission, which typically increases the power consumption of the radio (i.e., shorter life for a battery-operated radio).

Among many other PAPR mitigation methods, complementary sequences (CSs) allow one to limit the peak instantaneous power of OFDM signals without any optimization method. However, a low-PAPR encoder based on CSs is not a straightforward task since a set of different CSs is typically restricted in terms of size, sequence length, and alphabet. According to example embodiments, these issues are addressed via a set of methods for encoding and decoding based on "partitioned" CSs and exploiting the gaps between the parts of a partitioned CS to encode information bits.

Complementary sequences can be utilized for IEEE 802.11ad/ay (Wi-Fi at 60 GHz millimeter wave band) for channel estimation or beam training sequences. CSs have not been utilized for information transmission. According to some example embodiments, OFDM PAPR may be reduced in a communication system, e.g., DFT-spread OFDM via, for example, PAPR reduction methods based on forward-error correction.

According to various example embodiments, partitioned complementary sequences (CSs) may be implemented where the gaps between the clusters encode information bits to achieve low peak-to-average-power ratio (PAPR) coded orthogonal frequency division multiplexing (OFDM) symbols. Further, some example embodiments implement a partitioning rule without losing the feature of being a CS and may coincide with the non-squashing partitions of a positive integer, which can lead to a symmetric separation of clusters. The number of partitioned CSs may be analytically derived for a given bandwidth and a minimum distance constraint. The corresponding recursive methods may be obtained for enumerating partitions. Partitioning can increase the spectral efficiency (SE) without changing the alphabet of the non-zero elements of the CS, i.e., standard CSs relying on Reed-Muller (RM) code. An encoder for partitioned CSs can be implemented and a maximum-likelihood (ML)-based recursive decoder for additive white Gaussian noise (AWGN) and fading channels can be realized. The partitioned CSs under a minimum distance constraint can perform similar to the standard CSs in terms of error rate while providing a higher SE at the expense of a limited Eb/N0 loss.

Some example embodiments may be implemented in the context of OFDM with index modulation (IM) (OFDM-IM), i.e., activating/deactivating OFDM subcarriers with modulation symbols to convey extra information bits, see E. Basar, Ü. Aygölü, E. Panayirci, and H. V. Poor, "Orthogonal frequency division multiplexing with index modulation," *IEEE Trans. Signal Process.*, vol. 61, no. 22, pp. 5536-5549, August 2013. Index modulation (IM) is a subclass of permutation modulation, see D. Slepian, "Permutation modulation," *Proceedings of the IEEE*, vol. 53, no. 3, pp. 228-236, March 1965, and allows one to encode information in the order of discrete objects, which is incorporated herein. The concepts around IM may utilize various topics in number theory. For example, weak composition modulation (WCM), composition modulation (CM), and index and composition modulation (ICM), introduced for OFDM, see F. Yarkin and J. P. Coon, "Composition modulation," arXiv:2006.14400, pp. 1-5, June 2020 and "Index and composition modulation," arXiv:2009.13214, pp. 1-6, September 2020., use integer compositions.

For WCM, a weak composition of a non-negative integer into m parts is utilized to determine the energy levels of m subcarriers. The modulation orders on the activated subcarriers are then adjusted according to the weak compositions to transmit the same amount of information bits. For CM, the total OFDM symbol energy is divided into the subcarrier energy levels based on the composition of a positive integer into m parts. For ICM, the energy levels of the active subcarriers of OFDM-IM are set according to CM. In F. Yarkin and J. P. Coon, "Set partition modulation," *IEEE Trans. Wireless Commun.*, vol. 19, no. 11, pp. 7557-7570, November 2020 and "Q-ary multi-mode OFDM with index modulation," *IEEE Wireless Commun. Lett.*, vol. 9, no. 7, pp. 1110-1114, July 2020, set partition modulation (SPM) and its variants were proposed for OFDM. For SPM, the set of subcarrier indices are partitioned into m subsets, where disjoint constellations with identical sizes (e.g., sub-constellations of PSK or QAM alphabets based on the well-known set partitioning technique in G. Ungerboeck, "Channel coding with multilevel/phase signals," *IEEE Trans. Inf. Theory*, vol. 28, no. 1, pp. 55-67, January 1982.) are utilized for different subsets. SPM is similar to multi-mode OFDM-IM, see T. Mao, Z. Wang, Q. Wang, S. Chen, and L. Hanzo, "Dual-mode index modulation aided OFDM," *IEEE Access*, vol. 5, pp. 50-60, August 2017 and M. Wen, E. Basar, Q. Li, B. Zheng, and M. Zhang, "Multiple-mode orthogonal frequency division multiplexing with index modulation," *IEEE Trans. Commun.*, vol. 65, no. 9, pp. 3892-3906, May 2017 in the sense that both methods use distinguishable constellations, i.e., modes, for information transmission. However, SPM differs from multimode OFDM-IM in that it uses set partitions for the code construction rather than permutations of the constellations. In J. P. Coon, M. Badiu, Y. Liu, F. Yarkin, and S. Dang, "Binary-tree encoding for uniform binary sources in index modulation systems," *IEEE J. Sel. Topics Signal Process.*, vol. 13, no. 6, pp. 1270-1285, May 2019., the problem of designing bit-to-subcarrier activation pattern mappings and power allocation schemes for OFDM-IM were investigated based on binary trees. In A. Jaradat, J. M. Hamamreh, and H. Arslan, "Orthogonal frequency division multiplexing with subcarrier gap modulation," in *Proc. IEEE International Symposium on Personal, Indoor and Mobile Radio Communications (PIMRC)*, no. August, 2020, pp. 1-6, extra information bits were transmitted by exploiting the gap between the active subcarriers in each sub-block of OFDM-IM. However, the gaps are not tied to a special structure and associated encoding/decoding operations based on structured gaps are not considered. The studies in F. Yarkin and J. P. Coon, "Composition modulation," arXiv: 2006.14400, pp. 1-5, June 2020, "Index and composition modulation," arXiv:2009.13214, pp. 1-6, September 2020, F. Yarkin and J. P. Coon, "Set partition modulation," IEEE Trans. Wireless Commun., vol. 19, no. 11, pp. 7557-7570, November 2020, "Q-ary multi-mode OFDM with index modulation," IEEE Wireless Commun. Lett., vol. 9, no. 7, pp. 1110-1114, July 2020 and T. Mao, Z. Wang, Q. Wang, S. Chen, and L. Hanzo, "Dual-mode index modulation aided OFDM," IEEE Access, vol. 5, pp. 50-60, August 2017, M. Wen, E. Basar, Q. Li, B. Zheng, and M. Zhang, "Multiple-mode orthogonal frequency division multiplexing with index modulation," IEEE Trans. Commun., vol. 65, no. 9, pp. 3892-3906, May 2017, J. P. Coon, M. Badiu, Y. Liu, F. Yarkin, and S. Dang, "Binary-tree encoding for uniform binary sources in index modulation systems," IEEE J. Sel. Topics Signal Process., vol. 13, no. 6, pp. 1270-1285, May 2019, A. Jaradat, J. M. Hamamreh, and H. Arslan, "Orthogonal frequency division multiplexing with subcarrier gap modulation," in Proc. IEEE International Symposium on Personal, Indoor and Mobile Radio Communications (PIMRC), no. August, 2020, pp. 1-6 also do not particularly concern about the time-domain characteristics of the resulting symbols. However, since OFDM-IM is also based on OFDM, it also suffers from high PAPR. In A. Vora and K. Kang, "Index modulation with PAPR and beamforming for 5G MIMO-OFDM," in *Proc. IEEE 5G World Forum (5GWF)*, July 2018, pp. 389-394, circular-time shifts are applied to OFDM-IM to reduce the PAPR for multiple antennas. In K. Kim, "PAPR reduction in OFDM-IM using multilevel dither signals," *IEEE Commun. Lett.*, vol. 23, no. 2, January 2019 and J. Zheng and H. Lv, "Peak-to-average power ratio reduction in ofdm index modulation through convex programming," *IEEE Commun. Lett.*, vol. 21, no. 7, pp. 1505-1508, April 2017, the dither signals are considered to reduce the PAPR of OFDM-IM symbols by using convex optimization techniques. In S. Sugiura, T. Ishihara, and M. Nakao, "State-of-the-art design of index modulation in the space, time, and frequency domains: Benefits and fundamental limitations," *IEEE Access*, vol. 5, pp. 21 774-21 790, October 2017 and M. Nakao and S. Sugiura, "Dual-mode time-domain single-carrier index modulation with frequency-domain equalization," in 2017 IEEE 86th Vehicular Technology Conference (VTC-Fall), 2017, pp. 1-5., a single-carrier waveform with IM (SC-IM) is investigated for achieving a low PAPR transmission, which eliminates data-dependent optimization techniques. It was shown that the IM can slightly degrade the PAPR benefit of a typical single-carrier (SC) transmission with low-order modulations. This is expected as IM increases the zero crossings in the time domain for SC. In the extreme cases where there is a large DoF for indices with a few index choices, the PAPR of SC-IM symbols can even be worse than that of OFDM-IM due to pulses in an SC scheme S. Hogue, C.-Y. Chen, and A. Sahin, "A wideband index modulation with circularly-shifted chirps," in *Proc. IEEE Consumer Commun. & Netw. Conf. (CCNC)*, January 2021, pp. 1-6. Chen and Sahin also showed that circularly- shifted chirps with IM (CSC-IM) can provide a lower PAPR than SC-IM for low-data rates and chirps can be utilized for synthesizing CSs. Accordingly, as further described herein, CSs relying on, for example, Boolean functions have not been considered from the perspective of IM.

According to some example embodiments, a comprehensive analysis of partitioned CSs is provided. The number of partitioned CSs can be analytically derived for a given bandwidth. The derivation relies on the symmetric nature of the partitioning rule to be a CS, which is also related to non-squashing partitions of a positive integer. The number of CSs can increase by a large factor when partitioning is taken into account and the alphabet of the non-zero elements of the CS remains the same. The algorithms that map a natural number to a partition, or vice versa, will also be derived, which are needed for an encoder and an decoder based on partitions.

According to some example embodiments, partitioning under a minimum distance constraint can be implemented. To obtain the partitioned CSs under a minimum Euclidean distance constraint, a partitioning strategy may be implemented based on the symmetric structure of the partitioned CSs. For a given a minimum distance, the cardinality of the partitioned CSs can be derived and the algorithms that construct a bijective mapping between a natural number and a partition can be determined. Partitioned CSs can maintain the distance properties of the standard CSs while offering a similar SE and better flexibility in bandwidth.

With respect to an encoder and decoder for partitioned CSs, an encoder and a maximum-likelihood (ML)-based recursive decoder for partitioned CSs can be implemented. By using the proposed encoder and decoder, the partitioned CSs can be compared with the standard CSs in various configurations.

Notation: The sets of complex numbers, real numbers, integers, non-negative integers, positive integers, and integers modulo H are denoted by $\mathbb{C}$, $\mathbb{R}$, $\mathbb{Z}$, $\mathbb{Z}^+_0$, $\mathbb{Z}^+$, and $\mathbb{Z}_H$, respectively. The set of m-dimensional integers where each element is in $\mathbb{Z}_H$ is denoted by $\mathbb{Z}_H^m$. The assignment operation is denoted by ←. The notation $(a_i)_{i=0}^{N-1}$ represents the sequence $a=(a_0; a_1, \ldots, a_{N-1})$. An array of L sequences is denoted as $S=(a_i)_{i=1}^{L-1}$. The constant j is $\sqrt{-1}$. Let $(i_1; \ldots ; i_N)$ be permutation of $(1, \ldots, N)$. The sequence $(a_0, \ldots, a_{N-1})_{(i_0, \ldots, i_{N-1})}$ denotes $(a_{i_0-1}, \ldots, a_{i_{N-1}-1}$(, i.e., a permutation of $(a_0, \ldots, a_{N-1})$.

Sequences

A generalized Boolean function is a function f that maps from $\mathbb{Z}_2^m = \{(x_1, x_2, \ldots, x_m) | x_j \in \mathbb{Z}_2\}$ to $\mathbb{Z}_H$ for f: $\mathbb{Z}_2^m \to$ where $\mathbb{Z}_H$ is an integer. It can be uniquely expressed as a linear combination of the monomials over $\mathbb{Z}_H$, i.e., $$f(x) = \sum_{k=0}^{2^m-1} c_k \prod_{j=1}^{m} x_j^{k_j} = c_0 1 + \cdots + c_{2^m-1} x_1 x_2 \ldots x_m, \quad (1)$$

where the coefficient of (k+1)th monomial $x_1^{k_1} x_2^{k_2} \ldots x_m^{k_m}$ belongs to $\mathbb{Z}_H$, i.e., $c_k \in \mathbb{Z}_H$, $k = \sum_{j=1}^{m} k_j 2^{m-j}$ for $k_j \in \mathbb{Z}_2$, and $f(x)$ denotes the function $f(x_1, x_2, \ldots, x_m)$. The expression given in (1) is called algebraic normal form (ANF) of $f(x)$.

According to some example embodiments, the sequence f of length $2^m$ is associated with the function $f(x_1; x2, \ldots, x_m)$ by listing its values as $(x_1, x_2, \ldots, x_m)$ ranges over its $2^m$ values in lexicographic order (i.e., the most significant bit is x1). In other words, the (x+1)th element of the sequence f is equal to $f(x)=f(x_1, x_2, \ldots, x_m)$ where $x=\Sigma_{j=1}^m x_j 2^{m-j}$. For $f: \mathbb{Z}_2^m \to \mathbb{R}$, R, the corresponding sequences for the monomials in (1) construct a basis in $\mathbb{R}^{2^m}$ and $c_k \in \mathbb{R}$.

We define the polynomial representation of the sequence $a=(a_i)_{i=0}^{N-1}$ as $p_a(z) \triangleq a_{N-1} z^{N-1} + a_{N-2} z^{N-2} + \ldots + a_0$, for $z \in \mathbb{C}$. By restricting z to be on the unit circle in the complex plane, i.e., $$z \in \{e^{j\frac{2\pi t}{T_s}} \mid 0 \le t < T_s\}, p_a(z)$$

defines an OFDM symbol in continuous time, where $T_s$ denotes the OFDM symbol duration.

The sequence pair (a, b) is a GCP if $\rho_a(k)+\rho_b(k)=0$ for $k \neq 0$, where $\rho_a(k)$ is the aperiodic autocorrelation (APAC) of the sequence a, defined as $\rho_a^+(k)$ for $k \ge 0$ and $\rho_a^+(-k)^*$ for $k<0$ for $\rho_a^+(k)=\Sigma_{i=0}^{N-k-1} a_i^* a_{i+k}$ $k=0; 1, \ldots, N=1$ 1 and 0 otherwise. By using Theorem 2 discussed in Sahin and Yang, the CSs where the elements on the support are unimodular can be expressed as follows:

---

Theorem 1

Let $\pi = (\pi_n)_{n=1}^m$ be a sequence defined
by a permutation of $\{1, 2, \ldots, m\}$. For any d', $d_n, \in \mathbb{Z}_0^+$, $H \in \mathbb{Z}^+$,
and $k_n, k' \in \mathbb{Z}_H$ for $n = 1, 2, \ldots, m$, let $$f_i(x) = \frac{H}{2} \sum_{n=1}^{m-1} x_{\pi_n} x_{\pi_{n+1}} + \sum_{n=1}^{m-1} k_n x_{\pi_n} + k', \quad (2)$$

$$f_s(x) \sum_{n=1}^m d_n x_n + d'. \quad (3)$$

Then, the sequence $t = (t_x)_{x=0}^{L-1}$ where its polynomial representation given by $$p_t(z) = \sum_{x=0}^{2^m-1} \xi^{jf_i(x)} \times z^{x+f_s(x)}, \quad (4)$$

is a CS of length $L = 2^m + d' + \sum_{n=1}^m d_n$, where $\xi = e^{\frac{2\pi}{H}}$.

---

Note that Theorem 1 is a reduced form of Theorem 2 in Sahin and Yang. It only shows how the CS t is formed instead of a GCP. The polynomials related to the amplitude of the elements of the CS may be removed and the seed GCP may be used to develop an encoder based on (3). In addition, d' may be introduced that prepends d' zero-valued elements to the synthesized sequence without changing the properties of CSs. The domain of k' and $k_n$ may be changed from [0; H) to $\mathbb{Z}_H$ for $n \in \{1, 2, \ldots, m\}$, which leads a second-order RM code with H-PSK alphabet for (2), i.e., the construction in Davis and Jedwab. For $f_s(x) \neq 0$, the degree of $z^{x+f_s(x)}$ can be identical for different values of x, which causes superposition of the elements on the same index. In Sahin and Yang, the conditions given by $d_l \ge d_{l+1}+d_{l+2}+\ldots+d_m$, (5), for $1 \le l \le m-1$ is provided to avoid such superpositions. A CS may be called a non-partitioned CS if $d_n=0$ for $n \in \{1, 2, \ldots, m\}$. The set of non-partitioned H-PSK CSs based on (2) is referred to as standard CSs. If (5) holds and $d_n \neq 0$ for any n, the resulting sequence is denoted as a partitioned CS.

Figure 3:
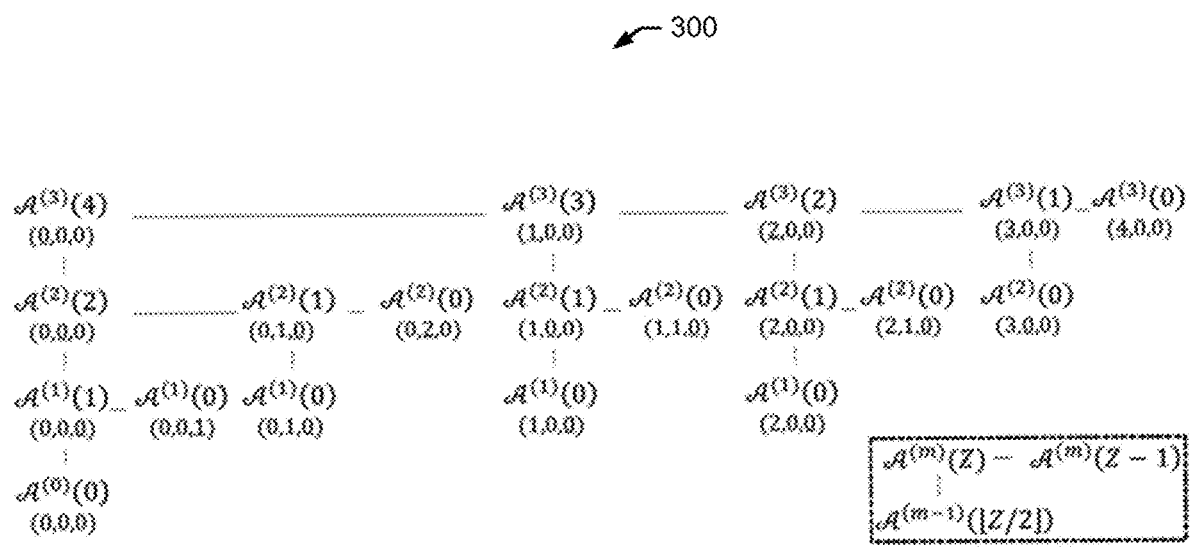
FIG. 3 shows a mapping enumerating $(s_1; s_2; s_3)$ such that $2^0 s_1 + 2^1 s_2 + 2^2 s_3 \leq 4$, based on Corollary 6 according to some example embodiments.

With respect to non-squashing partitions, a partition of a positive integer P into m parts, i.e., $P=p_1+p_2+\ldots+p_m$, is defined as non-squashing, see Sloane and Sellers, if $p_l \ge p_{l+1}+p_{l+2}+\ldots+p_m$ holds for $1 \le l \le m-1$ and $p_n \in \mathbb{Z}^+$ for $n=1; 2, \ldots, m$. The term of non-squashing partition was first coined in N. Sloane and J. A. Sellers, "On non-squashing partitions," *Discrete Mathematics*, vol. 294, no. 3, pp. 259-274, May 2005 for a problem called box-stacking problem. Assume that there are m boxes where each box is labeled as 1, 2, ..., m. Suppose that the nth box can support a total weight of n grams. How many different ways of putting the boxes in a single stack such that no box will be squashed by the weight of the boxes above it? The solution to this problem and a bijective mapping between binary partitions M. Hirschhorn and J. Sellers, "A different view of m-ary partitions," *Australasian Journal of Combinatorics*, vol. 30, pp. 193-196, 2004. and nonsquashing partitions were discussed in Sloane and Sellers, which also led to various generalizations on non-squashing partitions L. H. Sun and M. Zhang, "On the enumeration and congruences for m-ary partitions," *Journal of Number Theory*, vol. 185, pp. 423-433, April 2018, A. Folsom, Y. Homma, J. H. Ryu, and B. Tong, "On a general class of non-squashing partitions," *Discrete Mathematics*, vol. 339, no. 5, pp. 1482-1506, May 2016, and G. E. Andrews and J. A. Sellers, "On Sloane's generalization of nonsquashing stacks of boxes," *Discrete Mathematics*, vol. 307, no. 9, pp. 1185-1190, May 2007. The condition given in (5) for eliminating the superposition of elements of a CS may coincide with the non-squashing partitions of $P=\Sigma_{n=1}^m d_n$ to m parts, except that $d_n$ can be equal to zero. Considering this exception, $(d_1, d_2, \ldots, d_m)$ can be considered as a sequence, where $(d_1, d_2, \ldots, d_k)$ is a non-squashing partition of $P=\Sigma_{n=1}^k d_n \ge 1$ into k parts and $d_{k+1}=\ldots=d_m=0$ for a given $k \in \{1, \ldots, m\}$. For $k=0$, $d_n=0$ for $n \in \{1, 2, \ldots, m\}$ Given this foundation, example embodiments that implement partitioned complementary sequences are provided herein. In this regard, consider a baseband OFDM symbol synthesized based on (4) and assume that the condition in (5) holds true. Let M be the number of available subcarriers for the transmission. In this case, the number of zero-valued subcarriers in the frequency domain can be quantified as $Z=M-2^m$ since the number of non-zero elements of the sequence t is $2^m$ in Theorem 1. The Z zero-valued subcarriers for encoding extra information bits may be exploited by manipulating the support of sequence (i.e., partitioning the sequence t into several clusters) while still using the standard CSs, which are related to second order RM code, for the non-zero elements with (2), see Davis and Jedwab. In Theorem 1, the support of the sequence t is determined by the values of d' and $d_n$ for $n \in \{1, 2, \ldots, m\}$ based on the polynomial in (3). Hence, the partitioning cannot be done arbitrarily to maintain the properties of CSs. While d' shifts the sequence by prepending zeroes to the sequence, the impact of $d_n$ is governed by the monomial $x_n$. For example, $d_1$ causes the last $2^{m-1}$ seed sequences to be shifted by $d_1$ as the last $2^{m-1}$ elements of the corresponding sequence for the monomial $x_1$ in (3) is 1. For $d_2$, two clusters of size $2^{m-2}$ are shifted by $d_2$ since the corresponding sequence for $x_2$ has two clusters of size $2^{m-2}$. Under the condition given in (5), the impact of d' and $d_n$ for $n \in \{1, 2, \ldots, m\}$ on the support can be equivalently characterized by the distance between the nonzero clusters. Due to the monomials $x_1, \ldots, x_m$, the support of the sequence t changes symmetrically as illustrated in FIG. 3.

FIG. 1 shows a CSs partitioning 100 indicating the support of the CS changes based on the values of s' and $s_n$ for n={1, 2, 3}, where the number of zero-valued elements is $s'+s_1+2s_2+4s_3$. The number of zeroes can be chosen arbitrarily without losing the properties of a CS since the partitioning follows (3). FIGS. 2A-2D shows a series graphs 200, 210, 220, and 230 that indicate that partitioning CSs can substantially increase the number of information bits that can be encoded while doubling the spectral efficiency as compared to the case without partitioning (H=4). FIG. 3 shows a relational structure enumerating $(s_1; s_2; s_3)$ such that $2^0 s_1 + 2^1 s_2 + 2^2 s_3 \leq 4$, based on Corollary (6) described below. The underscored element indicates which one of $s_1$, $s_2$, and $s_3$ is modified. While moving downwards changes the underscore position, i.e., $u \leftarrow u+1$, moving from left to right changes $s_u$ as $s_u \leftarrow s_u + 1$.

For instance, a non-partitioned CS constructed with (2) can be partitioned in two clusters and the distance between the clusters can be arbitrarily chosen as $s_1 \in \mathbb{Z}_0^+$ without losing the features of CSs. Each cluster can also be divided into two sub-clusters equivalently and the distance between two subclusters can be controlled by another parameter $s_2 \in \mathbb{Z}_0^+$. The same partitioning process can be continued till mth step and the amount of separation at the nth step can be analytically expressed as $$s_n = d_n - \sum_{i=n+1}^{m} d_i, \quad (6)$$

for n=1, 2, . . . , m, which defines a bijective mapping between $(s_1; s_2; \ldots; s_m)$ and $(d_1; d_2; \ldots, d_m)$.

Given Z=M·2m zero-valued subcarriers, the next step is to determine how many $(d'; d_1; d_2; ; d_m)$ sequences exist under the condition in (5). The same problem can equivalently be stated as the number of different $(s'; s_1; \ldots; s_m)$ sequences such that $$s' + s_1 2^0 + s_2 2^1 + \ldots + s_m 2^{m-1} \leq Z, \quad (7)$$

where $s'=d' \in \mathbb{Z}_0^+$ and $s_n \in \mathbb{Z}_0^+$ for n=1, 2, . . . , m. This problem is directly related to 1) how to choose m for a given M degrees-of-freedom such that the number of synthesized CSs with partitioning is maximum, 2) how many extra information bits can be transmitted by changing the support of the synthesized CSs within the M subcarriers in the frequency domain and 3) if the partitioning can maintain the coding gain accomplished for the non-zero elements through the polynomial in (2), see Davis and Jedwab.

With respect to cardinality analysis, let $B^{(m)}(Z)$ be the number of different sequences $(s', s_1, s_2, \ldots, s_m)$ under the condition in (7). Since s' can range from 0 to Z, $B^{(m)}(Z)$ can be expressed as $$\mathcal{B}^{(m)}(Z) = \sum_{i=0}^{Z} \mathcal{A}^{(m)}(Z-i) = \sum_{i=0}^{Z} \mathcal{A}^{(m)}(i), \quad (8)$$

where $A^{(m)}(i)$ is the cardinality of the set of sequences $(s_1, s_2, \ldots, s_m)$ such that $\sum_{n=1}^{m} s_n 2^{n-1} \leq i$.

Theorem 2. Let $m \in \mathbb{Z}^+$ and $Y \in \mathbb{Z}_0^+$.

$$\mathcal{A}^{(m)}(Y) = \sum_{i=0}^{Y} \mathcal{A}^{(m-1)}\left(\left\lfloor \frac{i}{2} \right\rfloor\right), \quad (9)$$

where $A^{(1)}(Y)=Y+1$.

Proof. The condition $\sum_{n=1}^{m} s_n 2^{n-1} \leq Y$ can be expressed as $$\sum_{n=2}^{m} s_n 2^{n-2} \leq \frac{Y - s_1}{2}, \quad (10)$$

where $s_1$ can be any integer between 0 and Y. The cardinality of the sequences $(s_2, \ldots, s_m)$ under the condition in (10) can be expressed as $A^{(m-1)}(\lfloor (Y-s_1)/2 \rfloor)$. Therefore, $$A^{(m)}(Y) = \sum_{i=0}^{Y} A^{(m-1)}\left(\left\lfloor \frac{Y-i}{2} \right\rfloor\right), \quad (11)$$

for m=1, $A^{(1)}(Y)=Y+1$ since there is only $s_1$ that can be any integer between 0 and Y.

Accordingly, $A^{(0)}(Y) \triangleq 1$ can be defined. Note that $A^{(1)}(Y) = \sum_{i=0}^{Y} A^{(0)}(\lfloor i/2 \rfloor) = Y+1$ also holds true.

Since a bijective mapping between $(s_1; s_2; \ldots; s_m)$ and $(d_1; d_2; \ldots; d_m)$ can be constructed with (6), the following result can be obtained based on Theorem 2.

Corollary 3. The number of non-squashing partitions of P into n parts for all $1 \leq P \leq Y$ and $1 \leq n \leq m$ is $A^{(m)}(Y)-1$.

Theorem 2 also allows one to express $B^{(m)}(Z)$ concisely in a different form:

Corollary 4. Let m, $Z \in \mathbb{Z}_0^+$. $B^{(m)}(Z) = \frac{1}{2} A^{(m+1)}(2Z+1)$.

Proof. Equation (8) can be re-expressed as $B^{(m)}(Z) = \sum_{i=0}^{Z} A^{(m)}(i) = \frac{1}{2} \sum_{i=0}^{2Z+1} A^{(m)}(\lfloor i/2 \rfloor)$, where $\sum_{i=0}^{2Z+1} A^{(m)}(\lfloor i/2 \rfloor)$ is equal to $A^{(m+1)}(2Z+1)$ based on Theorem 2.

Based on Corollary (4), $B^{(m)}(Z)$ can be calculated efficiently by using a recursive algorithm for $A^{(m)}(Y)$ that exploits (9). It is well-known that the number of H-PSK CSs through the polynomial given in (2) is $C^{(m)}(H) \triangleq H^{m+1} m!/2$ and m>0 and $C^{(m)}(H) \triangleq H$ for m=0, H for m=0, where H is an even positive integer see Davis and Jedwab, K. G. Paterson, "Generalized Reed-Muller codes and power control in OFDM modulation," *IEEE Trans. Inf. Theory*, vol. 46, no. 1, pp. 104-120, January 2000. Let $D^{(m)}(M, H)$ denotes the number of different H-PSK CSs based on Theorem 1, where their lengths are less than or equal to M. By taking the partitioning into account, $D^{(m)}(M, H)$ can be obtained as follows:

Corollary 5. Let $m \in \mathbb{Z}_0^+$ and H, $M \in \mathbb{Z}^+$. $D^{(m)}(M, H) = B^{(m)}(M-2^m) C^{(m)}(H)$.

Let $n_{total}$, $n_{part}$, $n_{non-zero}$, and denote the number of maximum information bits represented by a CS, the number of maximum information bits conveyed by the partitions of a CS, the number of maximum information bits carried by the non-zero elements of a CS, and the SE, respectively. Based on Corollary (5), Corollary (5), $n_{total}$, $n_{part}$, $n_{non-zero}$, and $\rho$ can be calculated as $n_{total}=\log_2 \mathcal{D}^{(m)}(M, H)$, $n_{part}=\log_2 B^{(m)}(M-2^m$, $n_{non-zero}=\log_2 \mathcal{C}^{(m)}(H)$, and $\rho=\lfloor\log_2 \mathcal{D}^{(m)}(M, H)\rfloor/M$, respectively.

Figure 2A:
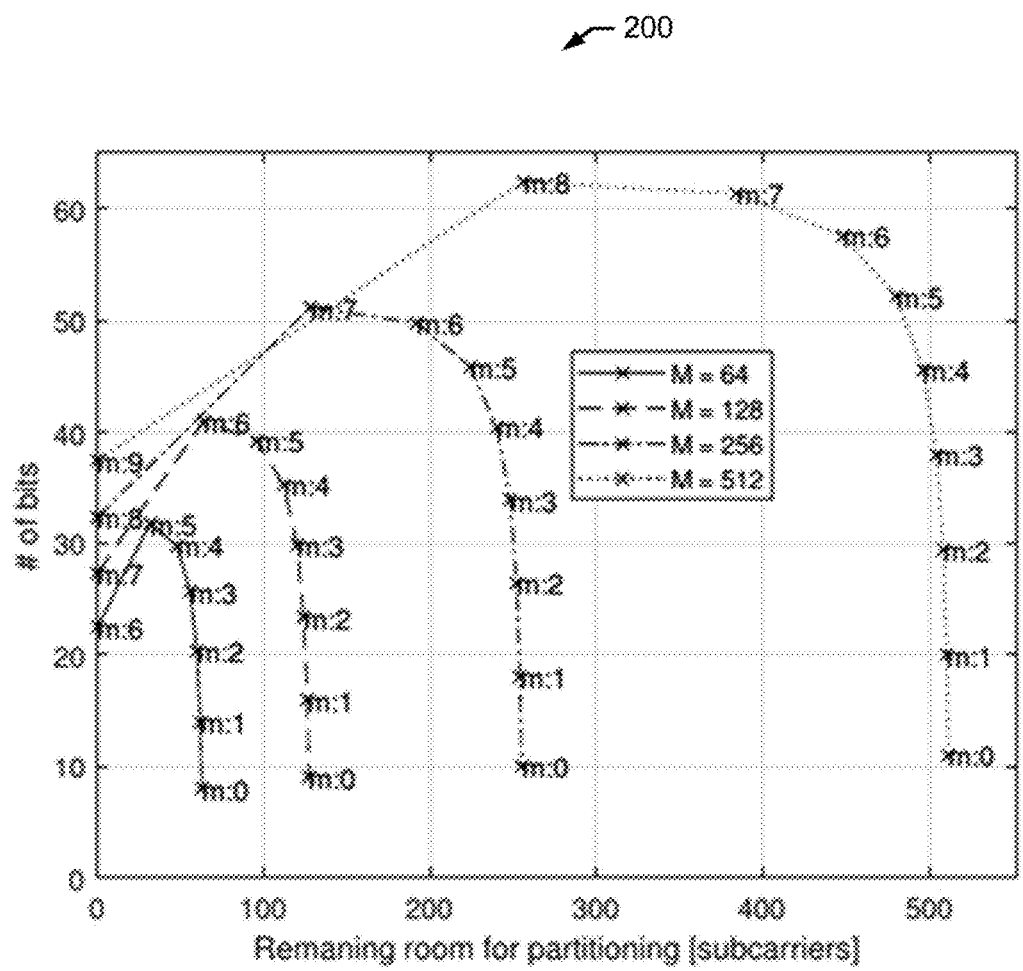
FIGS. 2A-2D show graphs illustrating that partitioning complementary sequences can substantially increase the number of information bits that can be encoded while doubling the spectral efficiency as compared to the case without partitioning (H=4) according to some example embodiments.
Figure 2B:
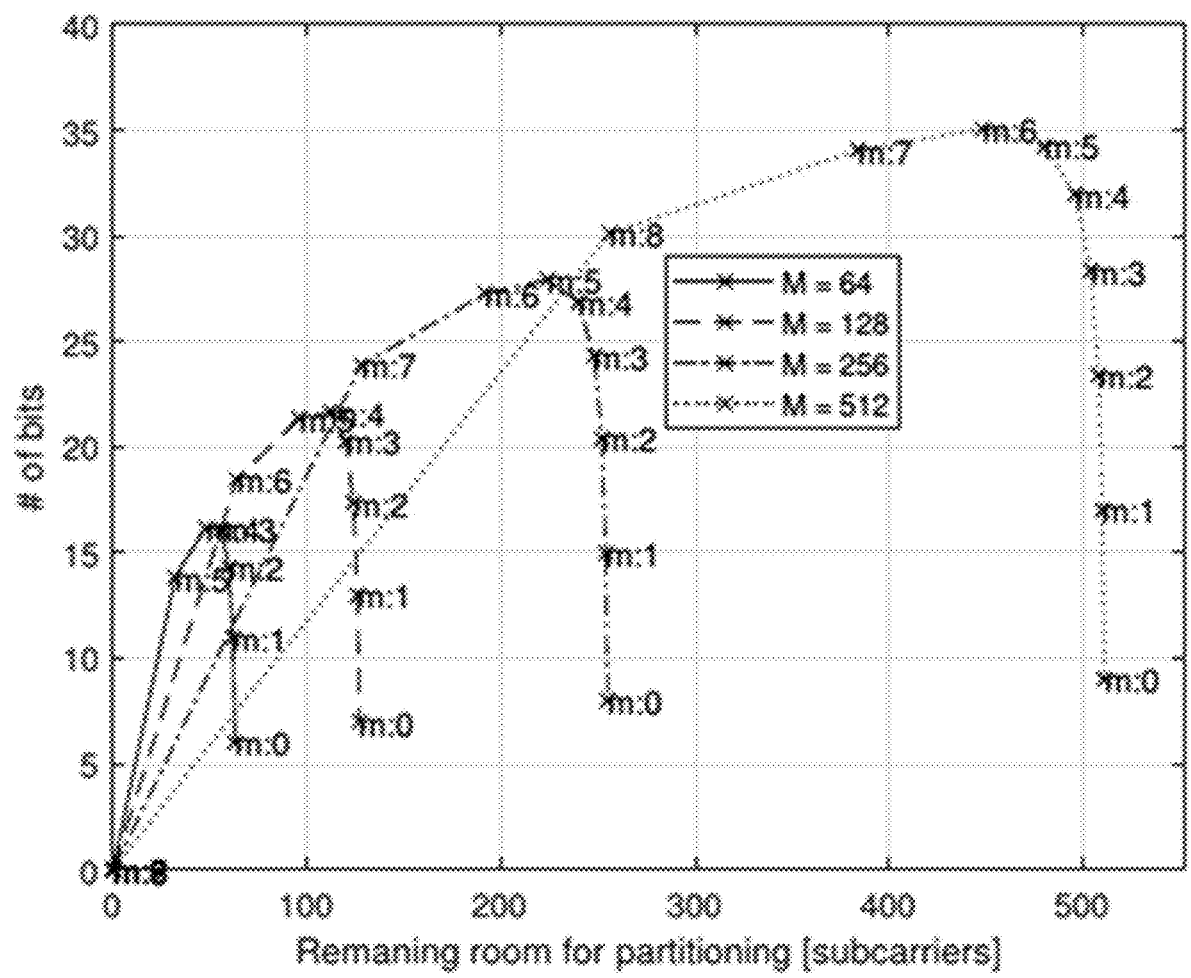
Figure 2C:
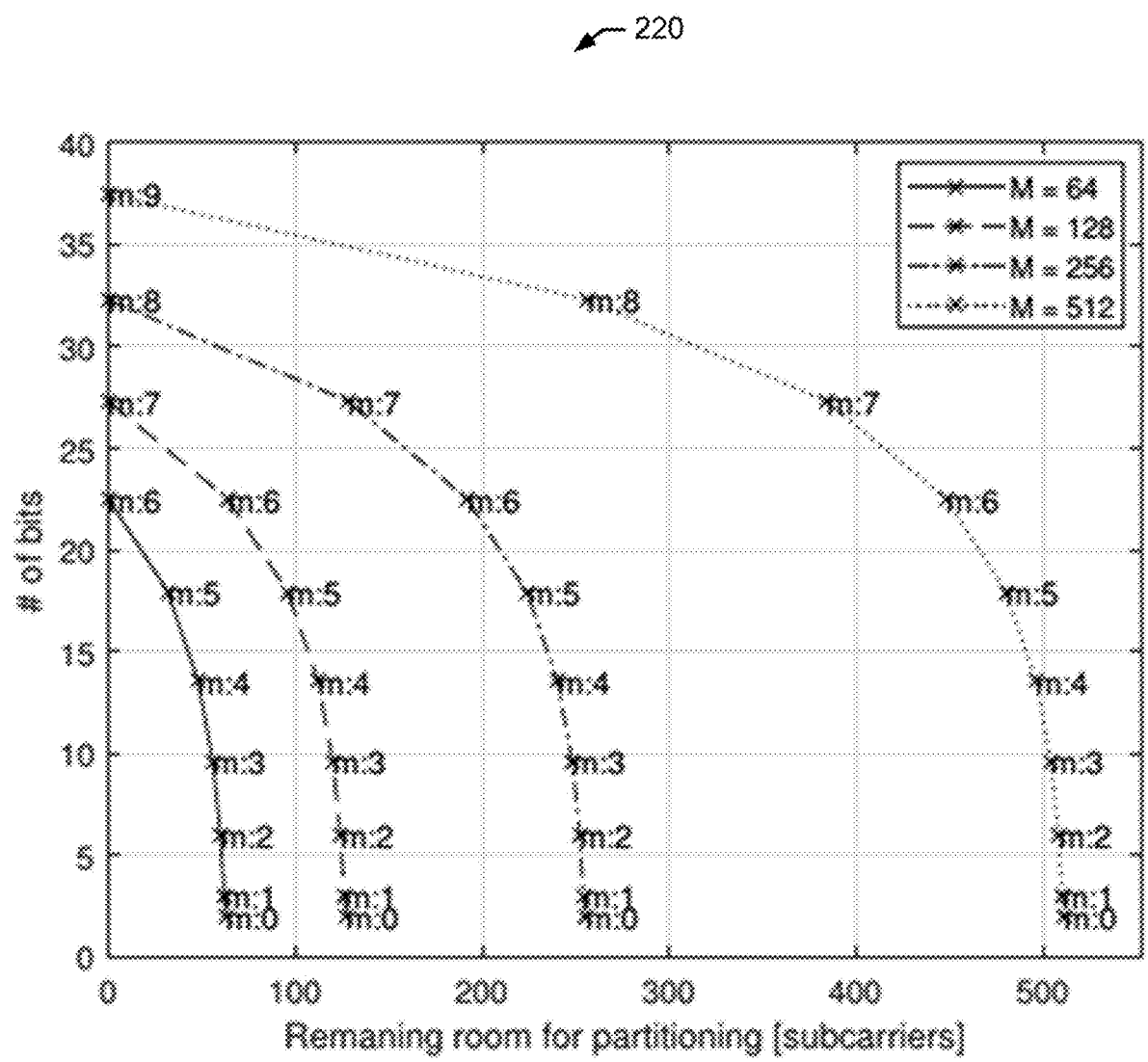
Figure 2D:
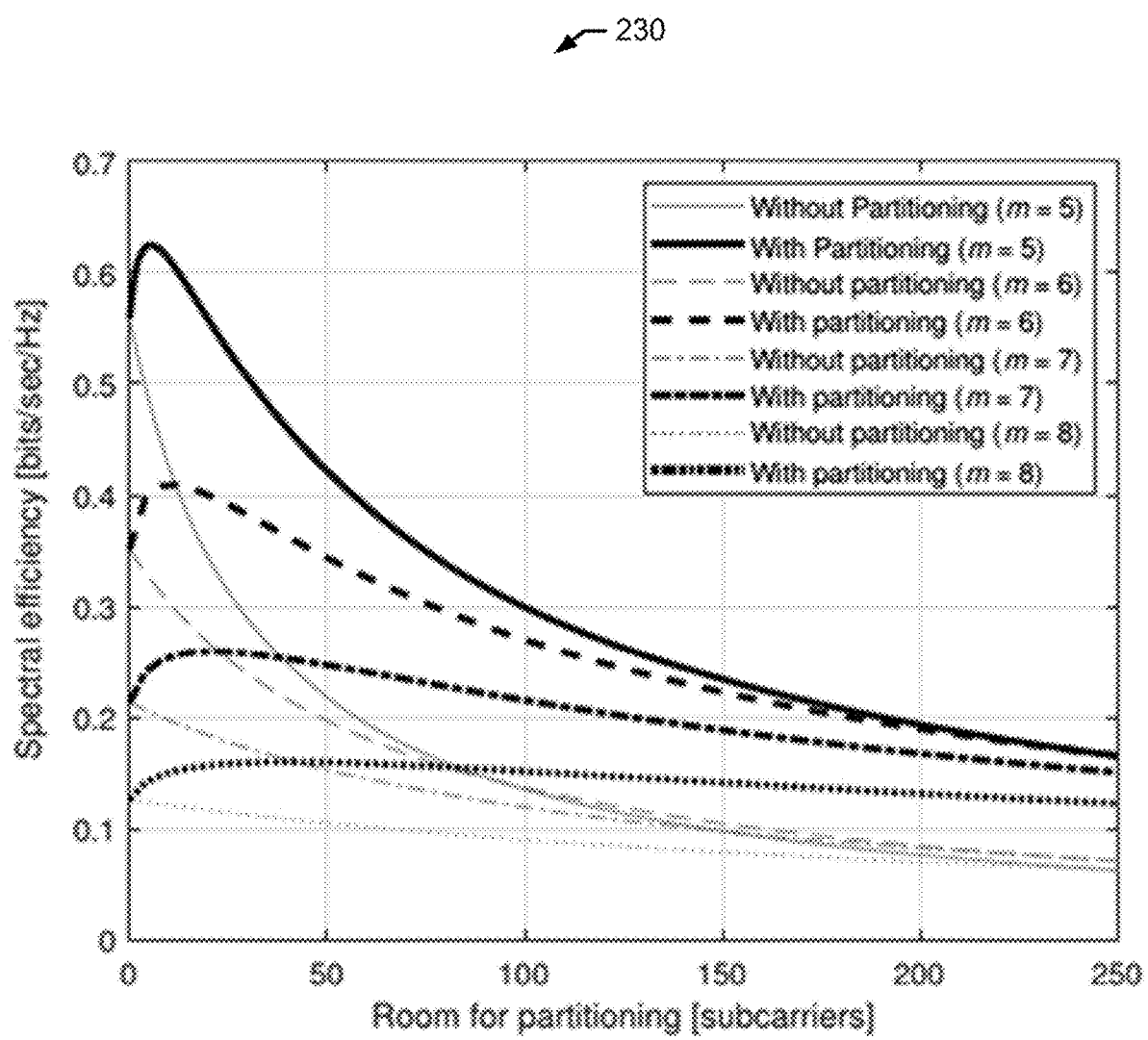

Referring to FIGS. 2A-2D, $n_{total}$, $n_{part}$, and $n_{non-zero}$ can be analyzed with respect to a change for given $M\in \{64, 128, 256, 512\}$ and $m\leq 9$ and a determination can be made as to how the SE $\rho$ is impacted for given Z and $m\in \{5, 6, 7, 8\}$ (H=4). The surprising result is that n total is not maximum when all available subcarriers are utilized based on the Davis and Jedwab's encoder in (2) as shown in FIG. 2A. For example, for M=512, $n_{total}$ reaches to 62.43 bits for m=8 and Z=256 while it is 37.47 bits for m=9 and Z=0. In other words, the number of different CSs by using only (2) is improved approximately by a factor of 225 without changing the alphabet of the non-zero elements of the CS (i.e., H-PSK) when the partitioning is taken into account. As shown in FIG. 2B, $n_{part}$ first increases by decreasing m as the remaining room for the partitioning increases. However, it sharply decreases after a certain value of m since the number of clusters (i.e., $2^m$) decreases for a smaller m. For m=0 and m=1, the sequences correspond to the ones with OFDM-IM with one block where the number of indices are 1 and 2, respectively, see Basar, Aygolu, et al. From this aspect, Theorem 1 reveals an interesting connection between OFDM-IM and the OFDM symbol constructed with the partitioned CSs. FIG. 2C illustrates how fast $n_{non-zero}$ decreases with a smaller m. Since $n_{part}$ increases faster than the degradation of $n_{non-zero}$ when m decreases (up to a certain value of m), $n_{total}$ improves, i.e., a large number of information bits can be encoded with the partitioned CSs. In FIG. 2D, the SE is almost doubled for a large Z, as compared to the case where there is no partitioning. The SE reaches its maximum for a non-zero Z. For example, when m is 5, 6, 7, and 8, the SE reaches its maximum, i.e., 0.62, 0.41, 0.26, and 0.16 bits/sec/Hz, for Z is 5, 11, 21, and 40 respectively. Enabling partitioning allows the transmitter to carry more information bits with CSs, i.e., $\rho(2^m+Z)$ bits, since Z can arbitrarily be chosen.

A description of bijection between natural numbers and separations will now be provided. To develop an encoder and a decoder based on the partitioned CSs, a mapping between the information bits and the sequence (s', $s_1, \ldots, s_m$) can be constructed for a given $Z=M-2^m$. To this end, a bijective mapping between a set of natural numbers and the set of separations, i.e., $\{(s', s_1, \ldots, s_m)\}$ can be developed.

With respect to mapping from natural numbers to separations, an approach similar to that proposed in Sloane and Sellers may be considered. In this regard, a decomposition of $A^{(m)}(Y)$ is as follows:

Corollary 6. Let $m, Y\in \mathbb{Z}_0^+$. $A^{(m)}(Y)=A^{(m-1)}(\lfloor Y/2\rfloor)+A^{(m)}(Y-1)$.

Proof. The right-hand side of ((9)) can be decomposed as $A^{(m-1)}(\lfloor Y/2\rfloor)+\Sigma_{i=0}^{Y-1}A^{(m-1)}(\lfloor i/2\rfloor)$, where $\Sigma_{i=0}^{Y-1}A^{(m-1)}(\lfloor i/2\rfloor)$ is equal to $A^{(m)}(Y-1)$ based on Theorem 2.

Based on the decomposition in Corollary 6, a sum tree may be formed until reaching $A^{(m')}(0)$ or $A^{(0)}(Y')$ for any $0\leq m'\leq m$ for any $0\leq m'\leq mi$ and $0\leq Y'\leq Y$. Accordingly, each node corresponds to a number, i.e., $A^{(m')}(Y')$, and the corresponding number on the node is equal to the sum of the values of its two children, i.e., $A^{(m'-1)}(\lfloor Y'/2\rfloor)$ and $A^{(m')}(Y'-1)$. The tree for $A^{(3)}(4)$ is exemplified in the relational structure 300 in the form of a graph in FIG. 3, where the dashed-line and the solid line represent the branches for nodes $A^{(m'-1)}(\lfloor Y'/2\rfloor)$ and $A^{(m')}(Y'-1)$, respectively. In the graph, no more branching occurs for a node where its label is either $A(m')(0)$ or $A^{(0)}(Y')$ since $A^{(m')}(0)$ and $A^{(0)}(Y')$ are equal to 1. As the graph is a sum tree and $A^{(m')}(0)=A^{(0)}(Y')=1$, the number of non-branching nodes (NBNs) must be equal to $A^{(m)}(Y)$. For example, in FIG. 3, there are 10 NBNs for $A^{(3)}(4)$ and $A^{(3)}(4)=10$. As a result, each NBN can represent a different sequence (s', $s_1, \ldots, s_m$).

Let $\epsilon_1(k, Y, m)$ be a function that returns the kth sequence for (s', $s_1, \ldots, s_m$) for given Y and m. Let $u\in 1, 2, \ldots, m$ be an integer. Assume that the initial value of u is 1 and the initial value of $s_n=0$ for $n=1, \ldots, m$. To obtain the kth sequence, a strategy may be considered that identifies the kth NBN in the graph. The function compares k with $A^{(m-1)}(\lfloor Y/2\rfloor)$. If k is less than or equal to $A^{(m-1)}(\lfloor Y/2\rfloor)$, the kth NBN should belong to the sub-tree branching out from the node $A^{(m-1)}(\lfloor Y/2\rfloor)$. In this case, the function increases u by 1, i.e., $u\leftarrow u+1$, and call $\epsilon_1(k, A^{(m-1)}(\lfloor Y/2\rfloor), m-1)$. Otherwise, the kth NBN should be on the sub-tree from $A^{(m)}(Y-1)$. In this case, the kth NBN of $A^{(m)}(Y)$ is the $(k-A^{(m-1)}(\lfloor Y/2\rfloor))$th NBN of $A^{(m)}(Y-1)$ since there must be $A^{(m-1)}(\lfloor Y/2\rfloor)$ NBNs on the other sub-tree. Hence, function increases $s_u$ by 1, i.e., $s_u\leftarrow s_u+1$, and call $\epsilon_1(k-A^{(m-1)}(\lfloor Y/2\rfloor), Y, m-1)$. This procedure continues recursively until exhausting m or k, i.e., m=0 or k=0, where the function returns the final (s', $s_1, \ldots, s_m$). The corresponding (s', $s_1, \ldots, s_m$) obtained with this procedure are provided for $A^{(3)}(4)$ in FIG. 3, where the underscored element indicates the value of u.

To identify the nth sequence for (s', $s_1, \ldots, s_m$), (8) can be utilized and (s', $s_1, \ldots, s_m$)=$\epsilon_1(k, Y, m)$. Let $\epsilon_2(n, Z, m)$ may be a function that returns the nth sequence for (s', $s_1, \ldots, s_m$) for given Z and m. Since $B^{(m)}(\check{Z})=\Sigma_{i=0}^{Z}A^{(m)}(Z-i)$, s' is the largest a such that $n_a=\Sigma_{i=0}^{a}A^{(m)}(Z-i)\leq n$. The remaining sequence (s', $s_1, \ldots, s_m$) can be identified by obtaining the sequence for the $(n-n_a)$th NBN of the corresponding sum-tree for $A^{(m)}(\check{Z}-s')$, i.e., $(s_1, \ldots, s_m)=\epsilon_1(n-n_a, Z-s', m)$.

With regard to mapping from separations to numbers, let $\delta_2((s', s_1, \ldots, s_m), Z, m)$ be a function that maps (s', $s_1, \ldots, s_m$) to a natural number n. By using (8), it first calculates how much s' contributes to n as $\Sigma_{i=0}^{s'-1}A^{(m)}(Z-i)=B^{(m)}(Z)-B^{(m)}(Z-s')$. Hence, n must be equal to $k+B^{(m)}(Z)-B^{(m)}(Z-s')$, where k is the natural number that is mapped to $(s_1, \ldots, s_m)$. Let $\delta_1((s_1, \ldots, s_m), Y, m)$ be a function that maps $(s_1, \ldots, s_m)$ to a natural number. In that case, k can be calculated as $\delta_1((s_1, \ldots, s_m), Z-s', m)$.

The function $\delta_1((s_1, \ldots, s_m), Y, m)$ exploits the sum tree and finds the kth NBN by using $(s_1, \ldots, s_m)$. Let the initial value of u, k, Z', m' be 1, 1, Z, and m, respectively. It calculates the number of NBNs while moving from left to right by $s_u$ times on the tree as exemplified in FIG. 3 and assign it to k, i.e., $k\leftarrow k+\Sigma_{i=0}^{s_u-1}A^{(m'-1)}(\lfloor Z'-i)/2\rfloor)$. It then updates Z', m', and u as $Z'\leftarrow\lfloor(Z'-s_u)/2\rfloor$, $m'\leftarrow m'-1$, and $u\leftarrow u+1$, i.e., moving downwards on the tree in FIG. 3 and calculates the number of NBNs for the new values of Z', m', and u. The function accumulates k for all $u\leq m$ and returns k as the corresponding natural number.

With respect to the minimum distance analysis, assume that H=2h for $h\in \mathbb{Z}^+$, and m>0. In Davis and Jedwab, it was shown that the minimum Lee distance of the code based on (2) for h=1 and h>1 are $2^{m-2}$ and $2^{m-1}$, respectively. Hence, for a given partition, the minimum Euclidean distance between the CSs can be calculated as $$d_{non-zero} = \begin{cases} \sqrt{M}\sin\left(\frac{\pi}{H}\right), & h=1 \\ \sqrt{2M}\sin\left(\frac{\pi}{H}\right), & h\geq 1 \end{cases} \quad (12)$$

This is due to the fact that the magnitude of each non-zero element is scaled to $r \triangleq \sqrt{M/2^m}$ as M subcarriers are utilized with partitioning and the minimum distance between for H-PSK alphabet is $$2r \sin\left(\frac{\pi}{H}\right).$$

Hence, to maintain the error-rate performance of the standard CSs, the minimum Euclidean distance between the CSs with different partitions, denoted as $d_{part}$, should be similar to $d_{non-zero}$. Without any restriction on $(s_0; s_1; \ldots; s_m)$, $d_{part} = r\sqrt{2} = \sqrt{M}\sqrt{2/2^m}$ since the supports of two CSs with two different partitions must differ from each other at minimum 2 different indices, e.g., $(2^{m-1}+1)$st and $(2^m+1)$th indices for $(s', s_1, \ldots, s_m) = (0; 0; \ldots; 0)$ and $(s', s_1, \ldots, s_m) = (0; 1; \ldots; 0)$. This result implies that the set of $(s', s_1, \ldots, s_m)$ should be restricted if a large minimum distance, i.e., $d_{min} \triangleq \min\{d_{non-zero}, d_{part}\}$, is desired.

Figure 4:
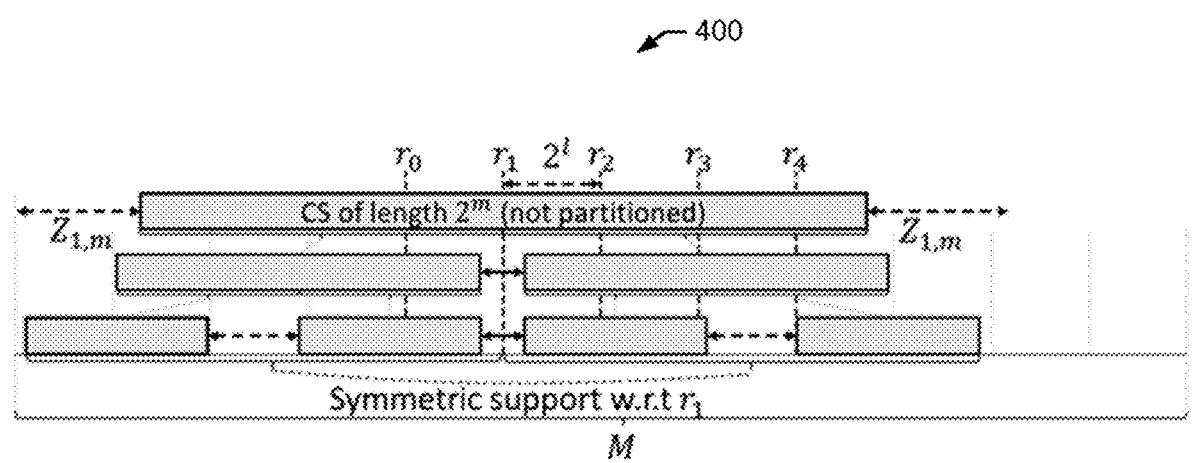
FIG. 4 shows a complementary sequence partitioning process under a minimum distance constraint according to some example embodiments.

Further, partitioning may be performed under a minimum distance constraint and cardinality. To obtain a larger $d_{part}$, the following strategy may be employed: Assume that Z is an integer multiple of $2^l$ for $l \in \mathbb{Z}_0^+$. Let $r_k = 2^{m-1} + k2^l - 0.5$ be the kth reference point for $k=0, 1, 2, \ldots, Z/2^l$. Restrict a valid partitioned CS to be symmetric with respect to one of the reference points as in the partitioning 400 shown in FIG. 4. In this case, the room for partitioning for the kth reference point can be calculated as $Z_{k,m} = \min\{k2^l, Z-k2^l\}$. Since two adjacent reference points are separated apart by $2_l$, the minimum distance between two CSs that do not share the same reference point must be $r\sqrt{2^{l+1}}$. To retain this distance, the minimum distance between two CSs with different partitioning that share the same reference point is $r\sqrt{2^{l+1}}$. To this end, the symmetricity of a partitioned CS may be exploited with respect to a reference point. The key observation is that both halves of a partitioned sequence CS have identical partitioning where each half follows the partitioning in FIG. 3. Therefore, if the minimum distance for one of the halves $r\sqrt{2^l}$, the minimum distance for the complete sequence increases to $r\sqrt{2^{l+1}}$ as shown in FIG. 4. The problem of obtaining partitions under the minimum distance of $2^l$ for one of the halves is equal to the original problem where the sequence length is $2^{m-1}$. Thus, the number of different partitions where $d_{part} = r\sqrt{2^{l+1}}$ can be calculated recursively as $$B^{(m,l)}(Z) = \sum_{k=0}^{Z/2^l} B^{(m-1,l-1)}(Z_{k,m}), \quad (13)$$

where $B^{(m,0)}(Z) = B^{(m)}(Z)$. Equation (13) leads to following conclusion:

Corollary 7. Let m, $h \in \mathbb{Z}^+$ and $M \geq 2^m$. For $H=2^h$ and $0 \leq l < m$, $D^{(m,l)}(M,H) = B^{(m,l)}(M-2^m) C^{(m)}(H)$, where $d_{min} = \{d_{non-zero}, \sqrt{M}\sqrt{2/2^{m-l}}\}$.

Figure 5A:
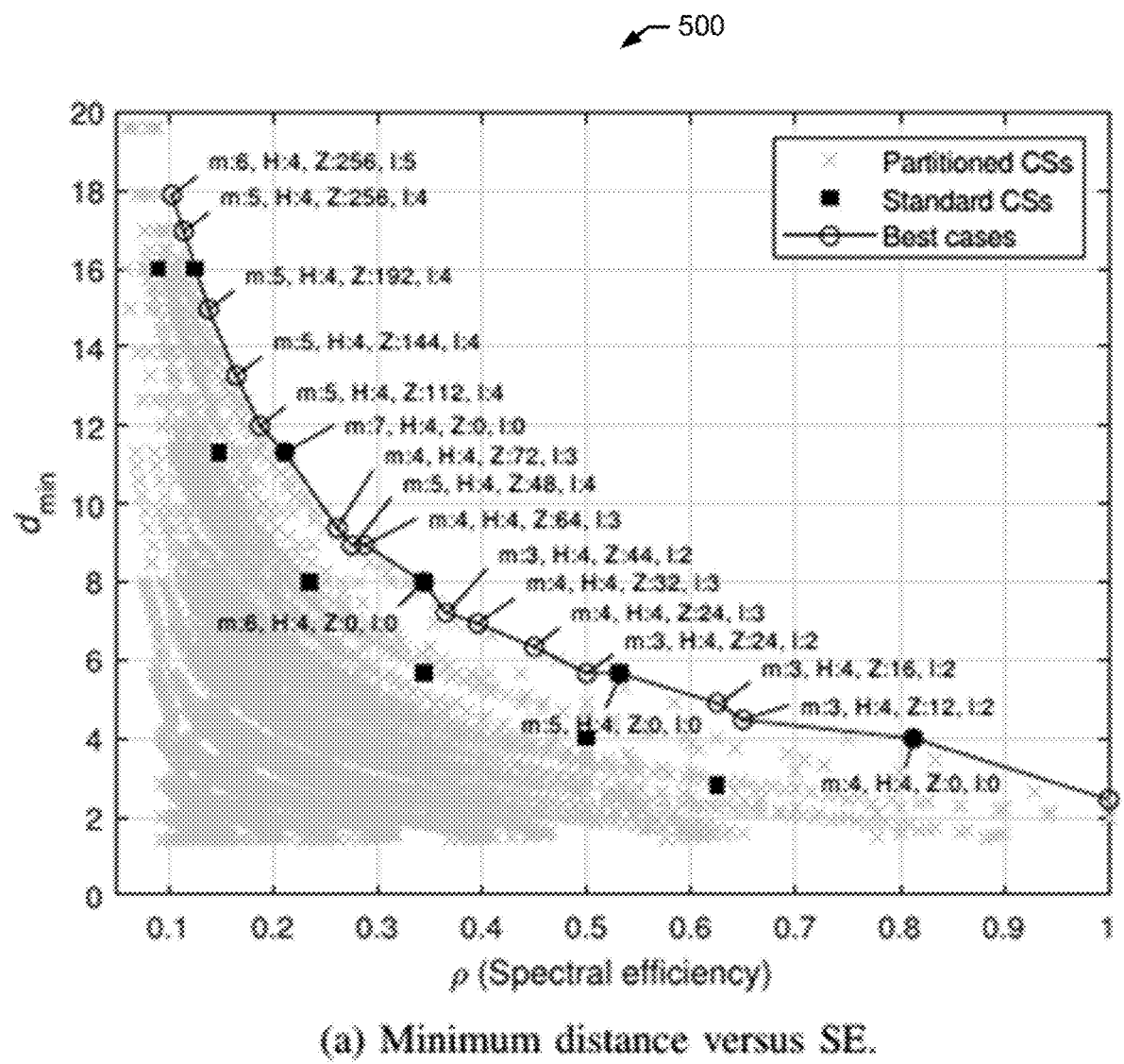
FIGS. 5A-5B show graphs illustrating that partitioned complementary sequences can maintain the minimum distance properties of standard complementary sequences in accordance with to some example embodiments.
Figure 5B:
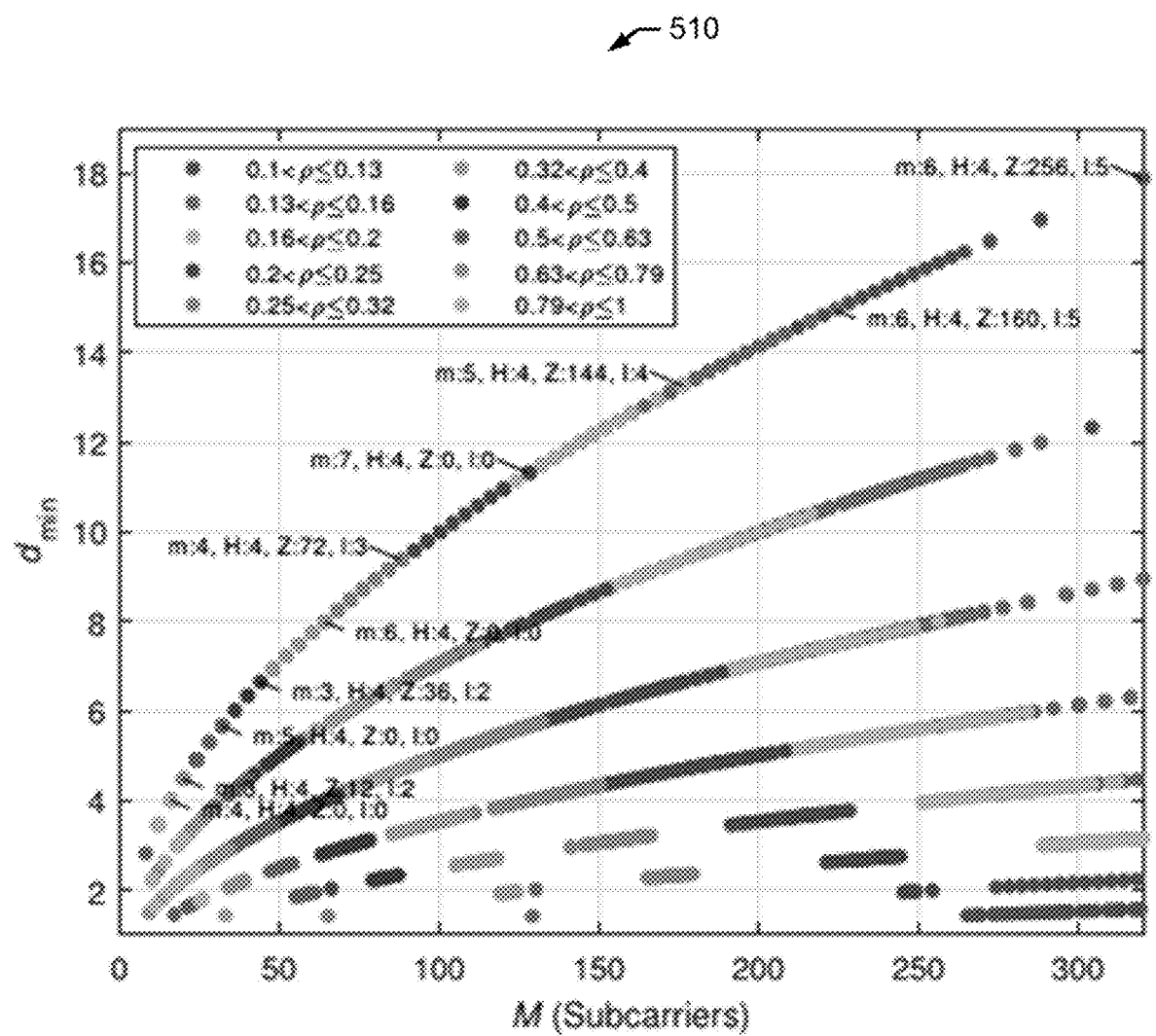

FIG. 4 shows partitioning 400 under a minimum distance constraint. The distance between two adjacent reference points is $2^l$. If the minimum distance for one of the halves is $r\sqrt{2^l}$, the minimum distance for the complete sequence increases to $r\sqrt{2^{l+1}}$ due to the symmetric support with respect to $r_k$. FIGS. 5A and 5B show graphs 500 and 510 indicating partitioned CSs can maintain the minimum distance properties of the standard CSs.

In FIGS. 5A and 5B, the trade-offs between minimum distance, SE, and bandwidth for partitioned CSs and the standard CSs can be considered by calculating these parameters for $m \in \{3, 4, 5, 6, 7, 8\}$, $0 \leq l < m$, $Z \in \{0, 1, \ldots, 256\}$, and $H=\{2, 4\}$. In FIG. 5A, p and $d_{min}$ are provided for all combinations and mark several best cases that provide the maximum minimum distance for a given SE. FIG. 5A shows that the partitioned CSs support a wide range of SE as opposed to the standard CSs based on (2). The partitioned CSs with a smaller m can achieve a similar $d_{min}$ of the standard CSs. For instance, $d_{min}=11.31$ for m=7 without partitioning, $d_{min}=12$ for m=5, Z=112, and l=4. In FIG. 5B, the impact of bandwidth on the minimum distance and SE is taken into account. For given SE range and bandwidth, the maximum achievable minimum distance can be determined. For example, when M=176 subcarriers, the maximum minimum distance, i.e., 13.27, is achieved for the configuration m=5, Z=144, and l=4, where the SE is p=29/176 bits/Hz/sec, which is between 0.16 and 0.2 bits/Hz/sec. In another example, for the configuration m=3, Z=12, and l=2, the SE is =13/20 bits/Hz/sec, i.e., within the range of 0.63 and 0.79 bits/Hz/sec, and it offers $d_{min}=4:47$. FIG. 5B explicitly shows that a larger $d_{min}$ is achieved for a larger M or a smaller p. Although the partitioning does not remedy the loss of SE for a larger M under a minimum distance constraint, it enables many different options for various SE and bandwidth while it can keep the minimum distance properties of the standard CSs, which is beneficial for increasing data rate.

Additionally, mapping from natural numbers to separations under the distance constraint can be performed. Let $\delta_2((s', s_1, \ldots, s_m), Z, m, l)$ be a function that converts the sequence $(s', s_1, \ldots, s_m)$ to a natural number n for given m, Z, and l. The function $\epsilon_3(n, Z, m, l)$ first calculates $n_a = \sum_{k=0}^{a} B^{(m-1,l-1)}(Z_{k,m}) \leq n$, it then obtains the sequence $(s_1, \ldots, s_m)$ by calling $(z', z_1, \ldots, z_{m-1}) = \epsilon_3(n-n_a, Z_{a,m}, m-1, l-1)$ and setting $s_1 = 2z'$ (due to the symmetric support of the halves) and $s_n = z_{n-1}$ for $n=2, \ldots, m$. It then calculates s' as $s' = a2^l - s_1 2^0 - s_2 2^1 - \ldots - s_m 2^{m-1}$. This procedure is recursive and the corresponding sequence for l=0 can be calculated through $\delta_2(n', Z', m')$ as discussed herein.

Mapping from separations under the distance constraint to natural numbers may also be performed. Let $\delta_3((s', s_1, \ldots, s_m), Z, n, l)$ be a function that converts the sequence $(s', s_1, \ldots, s_m)$ to a natural number n for given m, Z, and l. The function $\delta_2((s', s_1, \ldots, s_m), Z, m, l)$ first calculates $a = (s' + (s_1 2^0 + s_2 2^1 + \ldots + s_m 2^{m-1})/2)/2^l$ and $n_{a-1} = \sum_{k=0}^{a-1} B^{(m-1,l-1)}(Z_{k,m})$ for $a>0$, otherwise $n_{a-1}$ is zero. It returns n as $n_{a-1} + \delta_3((s_1, \ldots, s_m), Z_{a,m}, m-1, l-1)$. Similar to $\epsilon_3(n, Z, m, l)$, this is a recursive procedure and the corresponding integer for l=0 can be calculated through $\delta_2((s', s_1, \ldots, s_m), Z', m')$.

With respect to the encoder and decoder, the partitioned CSs may be utilized for transmitting information bits for synthesizing low-PAPR coded-OFDM symbols and corresponding encoding and decoding operations. With respect to the encoder, the information bits may be split into two bit sequences that are mapped to $(k', k_1, \ldots, k_m)$ and $\{\pi, (s', s_1, \ldots, s_m)\}$, i.e., $b_{phase}$ and $b_{\pi,part}$, respectively. A conversion of $b_{\pi,part}$ to a decimal number $i_{\pi,part}$ may then be performed. To obtain $\pi$ and $(s', s_1, \ldots, s_m)$, decomposition of $i_{\pi,part} = i_{part} m!/2 + i_\pi$ may be performed such that $i_{\pi<m!/2}$ for $i_\pi, i_{part} \in \mathbb{Z}_0^+$. A factoradic based on Lehmer code math, see D. Lehmer, "Teaching combinatorial tricks to a computer," in *Proc. Sympos. Appl. Math. Combinatorial Analysis Amer.*

*Math. Soc.*, vol. 10, 1960, pp. 179-193, to obtain from i. To avoid using $\pi$ and its reversed version, it may be considered that $\pi_1 > \pi_m$. For (s', $s_1, \ldots, s_m$), the partitioning may be adopted with a minimum distance constraint as discussed herein and use $\epsilon_3(i_{part}+1, Z, m, 1)$. For (k', $k_1, \ldots, k_m$), the bit mapping is done based on a Gray mapping, e.g., 00→0, 01→1, 10→3, and 11→2 for H=4. After obtaining $\pi$, (k', $k_1, \ldots, k_m$), and (s', $s_1, \ldots, s_m$), the corresponding baseband OFDM symbol $p_r(z)$ is calculated via (4). Note that obtaining the OFDM symbol by partitioning the CS in the frequency domain based on (s', $s_1, \ldots, s_m$) is equivalent to the calculation of $p_r(z)$ based on (d', $d_1, \ldots, d_m$), where ($d_1, \ldots, d_m$) can be derived from ($s_1, \ldots, s_m$) by using the system of linear equations given in (6) and d'=s'.

With respect to the decoder, at the receiver side, the xth element of the received signal can be expressed as $r_x = c_x t_x + n_x$, where $c_x$ and $n_x$ are the complex fading channel and the noise coefficients, respectively. Assuming that the channel coefficients are available at the receiver, an ML decoder corresponds to a minimum distance decoder for additive white Gaussian noise (AWGN), i.e., $$\{\hat{\theta}, \tilde{s}\} = \operatorname*{argmin}_{\{\theta, s\}} \sum_{x=0}^{2^m-1} |c_{I_s(x)} \xi^{jf_i(x;\theta)} - r_{I_x(x)}|^2 \tag{14}$$

$$= \operatorname*{argmin}_{\{\theta, s\}} \Re\left\{\sum_{x=0}^{2^m-1} \xi^{-jf_i(x;\theta)} w_{I_s(x)}\right\} - q_s, \tag{15}$$

where $w_x = c_x^* r_x$, $q_s = \sum_{x=0}^{2^m-1} h_{I_s(x)}$ is the channel quality information, $h_x = |c_x|^2/2$, $\theta = \{\pi, k', k_1, \ldots, k_m\}$, s=(s', $s_1, \ldots, s_m$), and $I_s(x) = x + f_s(x)$.

To solve (15), the principle discussed in Sahin and Yang may be considered and modified by introducing simplifications due to the PSK alphabet for the non-zero elements of the partitioned CSs. As done in Sahin and Yang, first decomposition of $f_i(x; \theta)$ as $f_i(x; \theta) = g_i^l(x^l; \psi) + x_l f_i^l(x^l; \phi)$ for l={1, 2, ..., m} may be performed, where $x^l \triangleq (x_1, x_2, \ldots, x_{l-1}, x_{l+1}, \ldots, x_m)$, and calculate $f_i^l(x^l)$ as $$f_i^\ell(x^\ell) = \frac{\partial f(x)}{\partial x_\ell} = \begin{cases} k_m + \frac{H}{2} x_{\pi_{m-1}}, & \pi_m = \ell \\ k_n + \frac{H}{2} x_{\pi_{n-1}} + \frac{H}{2} x_{\pi_{n+1}}, & \pi_n = \ell \\ k_1 + \frac{H}{2} x_{\pi_2}, & \pi_1 = \ell \end{cases} \tag{16}$$

By using this decomposition, we then re-write the objective function in (15) as $$\max_{\{\psi,\phi,s\}} \Re\left\{\sum_{x=0}^{2^{m-1}-1} \xi^{-jg_i^\ell(x;\psi)} w'_{x,s,\ell}\right\} - q_x, \text{ where} \tag{17}$$

$$w'_{x,s,\ell} = w_{I_s}(M_\ell(x)) + w_{I_s}(M_\ell(x) + 2^{m-\ell}) \xi^{-jf_1^\ell(x;\phi)}, \tag{18}$$

and $M_l(x)$ is a mapping function that maps an integer between 0 and $2^{m-1}-1$ to the value of $x = \sum_{j=1}^{m} x_j 2^{m-j}$ in ascending order for $x_l = 0_x$. Let $(w'_i)_{i=0}^{N_{enum}-1}$ be an array of $N_{enum}$ sequences, where $w'_i = (w'_{x,s,l})_{x=0}^{2^{m-1}-1}$ based on the ith enumeration of the parameter set $\phi$, denoted as $\phi_i$, for a given s. Assume that there is an algorithm, see FIG. 9, which solves (17) and returns the detected parameter set, i.e., $\tilde{\psi}_i$, for given $\phi$. In that case, (17) can also be calculated for i=1, ..., $N_{enum}$ and the optimum parameter set for a given s can be obtained as $\tilde{\theta}_s = \tilde{\psi}_{\tilde{n}_m} \cup \phi_{\tilde{n}_m}$, where $\tilde{n}_n$ is the index of the parameter set that maximizes (17). If the same procedure is applied for all possible sequences for s, the optimum $\tilde{s}$ can also be obtained. This decoding approach can be utilized in a parallel fashion with a recursive algorithm and a majority of the unpromising sequences can be terminated early to simplify the decoder as discussed in the following subsection.

With respect to a recursive algorithm with pruning, let $W_m = (W_n)_{n=0}^{N-1}$ denote an array of N sequences, where $w_n = (w_{n,x})_{x=0}^{2^{m-1}-1}$. Let also $q_m = (g_n)_{n=0}^{N-1}$ and $l_m = (l_n)_{n=0}^{N-1}$ be sequences of length N, where their nth elements are the channel quality information and $\pi_1$ for the nth sequence in $W_m$. The decoder that returns the sequence index $\tilde{n}_m$, where the (n=$\tilde{n}_m$)th sequence in $W_m$ maximizes $$\max_\theta \Re\left\{\sum_{x=0}^{2^m-1} \xi^{-jf_i(x;\theta)} w_{n,x}\right\} - q_n, \tag{19}$$

and the detected $\pi$ and (k', $k_1, \ldots, k_m$) for the corresponding sequence can then be expressed as ($\tilde{n}_m$, $\pi$, $k_1, \ldots, k_m$, k')=dec($W_m$, $q_m$, $l_m$). For given $W_m$, $q_m$, and $l_m$, the decoder first enumerates $_{m-1} = (w'_i)_{i=0}^{N_{enum}-1}$ for $w'_i = (w'_{i,x})_{x=0}^{2^{m-1}-1}$, $q_{m-1} = (q'_i)_{i=0}^{N_{enum}-1}$, and $l_{1-1} = (l'_i)_{i=0}^{N_{enum}-1}$, where $N_{enum}$=(m-1)HN for m>1 and $N_{enum}$=HN, for m=1, $$w'_{i,x} = w_{n,M_\ell(x)} + w_{n,M_\ell(x)} + 2^{m-l} \xi^{-jf_1^\ell(x;\phi)}, \tag{20}$$

$$q'_i = q_n, \tag{21}$$

$$l'_i = p+1, \tag{22}$$

and $$f_i^\ell(x^\ell) = k_1 + \frac{H}{2} x_{\pi_2} \text{ for } \pi_1 = \ell = l_n,$$

i.e., $\phi = \{k_1, \pi_2\}$, where $\pi_2$ is the pth element of the sequence (1, ..., l-1, l+1, ..., m) and $\underline{k}_1$ is the uth element of the sequence (0, 1, ..., H-1). We choose $$n = \begin{cases} \lfloor i/((m-1)H) \rfloor, & m > 1 \\ \lfloor i/H \rfloor, & m = 1 \end{cases}, \tag{23}$$

$$p = \begin{cases} \mod(\lfloor i/H \rfloor, m-1), & m > 1 \\ 0, & m = 1 \end{cases}, \tag{24}$$

$$u = \mod(i, H), \tag{25}$$

for the indexing the enumerations. For m 22 1, the decoder then calls itself as ($\tilde{n}_{m-1}$, $\pi'$, $k_2, \ldots, k_m$, k')=dec($W_{m-1}$, $q_{m-1}$, $l_{m-1}$) for $\pi' = (\pi'_1, \ldots, \pi'_{m-1})$ and obtains $\tilde{n}_m$=b $\tilde{n}_{m\cdot1}$=((m·1)H)c, $k_1$=mod($\tilde{n}_m$; H), as $\tilde{n}_m \lfloor \tilde{n}_{m-1}/((m-1)H) \rfloor$, $k_1$=mod($\tilde{n}_m$, H), $\pi_1$ as $\tilde{n}_m$th element of $l_m$, and ($\pi_2, \ldots, \pi_m$) as the permutation of the elements of the sequence (1, ..., $\pi_1$-1, $\pi_1$+1, ..., m) based on ($\pi'_1, \ldots, \pi'_{m-1}$), i.e., (1, ..., $\pi_1$-1, $\pi_1$+1, ..., m)$_{\pi'}$. For m=1, the decoder uses an ML detector by using $W_{m-1}$ and $q_{m-1}$ and returns the best index $\tilde{n}_m = \lfloor i/H \rfloor$, $k_1$, k', and $\pi$=1. Pruning $W_{m\cdot1}$ (and the corresponding elements of $q_{m\cdot t}$ and $l_{m\cdot1}$) may be performed to avoid exponential growth through the recursions. To this end, the decoder calculates the score given by $$\sum_{x=0}^{2^{m-1}-1} \max_{c_x \in \mathbb{Z}_H} \left( \Re\{ \xi^{-jc_x} w'_{i,x} \} \right) - q_i, \quad (26)$$

i.e., a high signal-to-noise ratio (SNR) estimation of (19), for all sequences in $W_{m-1}$ as the PSK alphabet is used. The detector then chooses $N_{best}$ sequences based on the score and terminates others before calling itself for m>1. Note that the indices of the chosen sequences need to be kept to trace back the best sequence index in the case of pruning. The indices may be stored in the sequence $n_{m-1}$.

The decoder $dec(W_m, q_m, I_m)$ solves $\pi$, $k_1$, ..., $k_m$, and k' for the most likely sequence in $W_m$ for given $\pi_1$, efficiently. To obtain the most likely partition) by utilizing $dec(W_m, q_m, I_m)$, a selection of $N_{select}$ of $(w_{I_s(x)})_{x=0}^{2^{m-1}-1}$ may be performed for different s based on (26). Since the receiver does not know $\pi_1 \in \{1, 2, \ldots m\}$ in advance, the selected sequences may be repeated m times and populate them in $W_m$, which leads to $N=mN_{select}$. The corresponding channel quality information and hypothesized $\pi_1$ are listed in $q_m$ and $I_m$, respectively. After s is obtained, $i_{part}$ is calculated as $i_{part}=\delta_2(s, Z, m, 1)-1$. Therefore, $i_{\pi,part}$ can be obtained as $i_{\pi,part}=i_{part}m!/2+i_\pi$, where $i_\pi$ is the corresponding integer for $\pi$. It is worth noting that if the detected $\pi_1$ is less than the detected $\pi_m$, the detector reverses the elements of and the detected $(k_1, \ldots, k_m)$. Finally, the decoder converts the decimal $i_{\pi,part}$ and the sequence $(k_1, \ldots, k_m, k')$ to $b_{\pi,part}$ and $b_{phase}$, respectively. The algorithm is summarized in Algorithm 1 in table 900 of FIG. 9.

The complexity of the decoder is particularly high at the initialization and the pruning stage of the first recursion. To initialize the algorithm, $N_{select}$ sequences $(w_{I_s(x)})_{x=0}^{2^{m-1}-1}$ need to be identified among all possible separations. The identification based on (26) requires at $B^{(m,l)}(Z) \times 2^{m+1}$ real additions for both received signal and the channel coefficients and a sorting algorithm for $B^{(m,l)}(Z)$ scores to find $N_{select}$ best candidates for the separations. It is worth noting that identifying the indices based on sorted subcarrier energy levels can reduce the initialization complexity, substantially. However, since a single misidentified index causes an ordering problem (i.e., the decoder needs to deal with not only noise but also permuted and/or erased elements), the decoder with such simplifications tends to work only at high SNR. After the initialization, at the pruning stage of the first recursion, the decoder enumerates $H(m-1)mN_{select}$ sequences of length $2^m$, from $mN_{select}$ sequences of length $2^m$. It then prunes a majority of the sequences, i.e., $N_{best}$ of them survive. Since the pruning process depends on (26), the computational resources are needed for $H(m-1)\overline{m}N_{select} \times 2^{m-1}$ real additions and a sorting algorithm for $H(m-1)mN_{select}$ scores. In general, the decoder enumerates $(m-i)HN_{best}$ sequences of length $2^{m-1}$ at the ith recursion step for i>1 and chooses $N_{best}$ sequences. However, at $N_{select}$ may need to be larger than $N_{best}$ for a large Z. Thus, the first stage is the most expensive part as compared to the following steps in the recursions.

The partitioned CSs may be evaluated for an OFDM-based system, numerically. The standard CSs may be considered proposed in Davis and Jedwab for side-by-side comparisons. The OFDM symbol duration may be $T_s=66.7$ s. ITU Vehicular A may be used for the multi-path fading channel model. The cyclic prefix (CP) duration may be longer than the maximum-excess delay of the multi-path channel to avoid inter-symbol interference. For the evaluations, two different groups may be considered for the partitioned CSs: 1) partitioned CSs that maximize the SE without any minimum Euclidean distance constraint, i.e., l=0, for a given bandwidth, i.e., $M \in \{16, 32, 64, 128\}$ based on FIG. 2; and 2) partitioned CSs that maintain the minimum Euclidean distance of the standard CS, based on the marked points in FIG. 5, i.e., {(m=3, Z=12, l=2), (m=3, Z=36, l=2), (m=3, Z=72, l=3), (m=5, Z=144, l=4)}. For the standard CSs, $m \in \{4, 5, 6, 7\}$ may be considered. For some or all schemes, quadrature phase shift keying (QPSK) may be used where, i.e., H=4. For the decoder, set $N_{select}=10000$ and $N_{best}=400$.

Figure 6A:
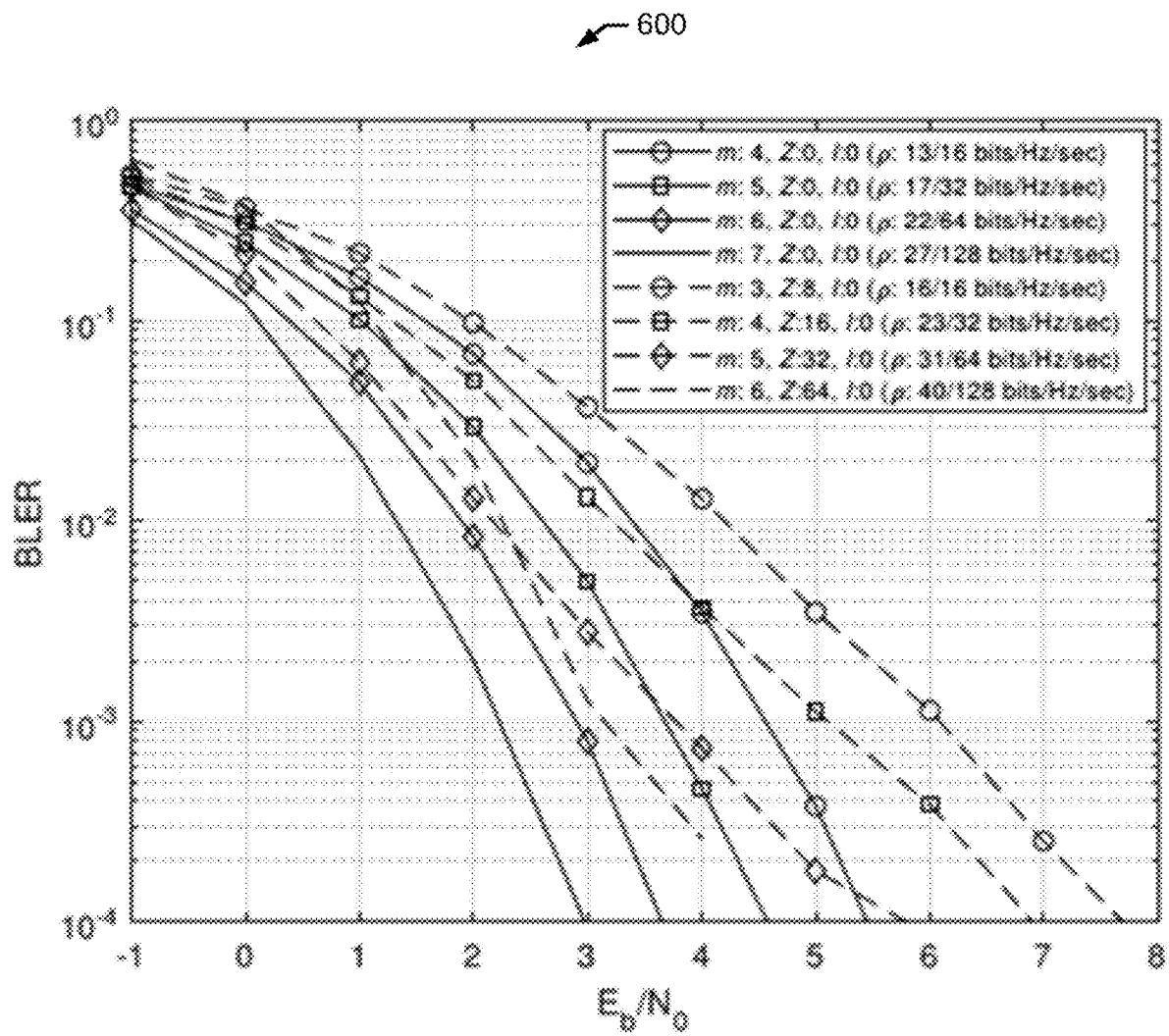
FIGS. 6A-6D show graphs of the block error rate performance of partitioned complementary sequences as compared to that of standard complementary sequences in accordance with some example embodiments.
Figure 6B:
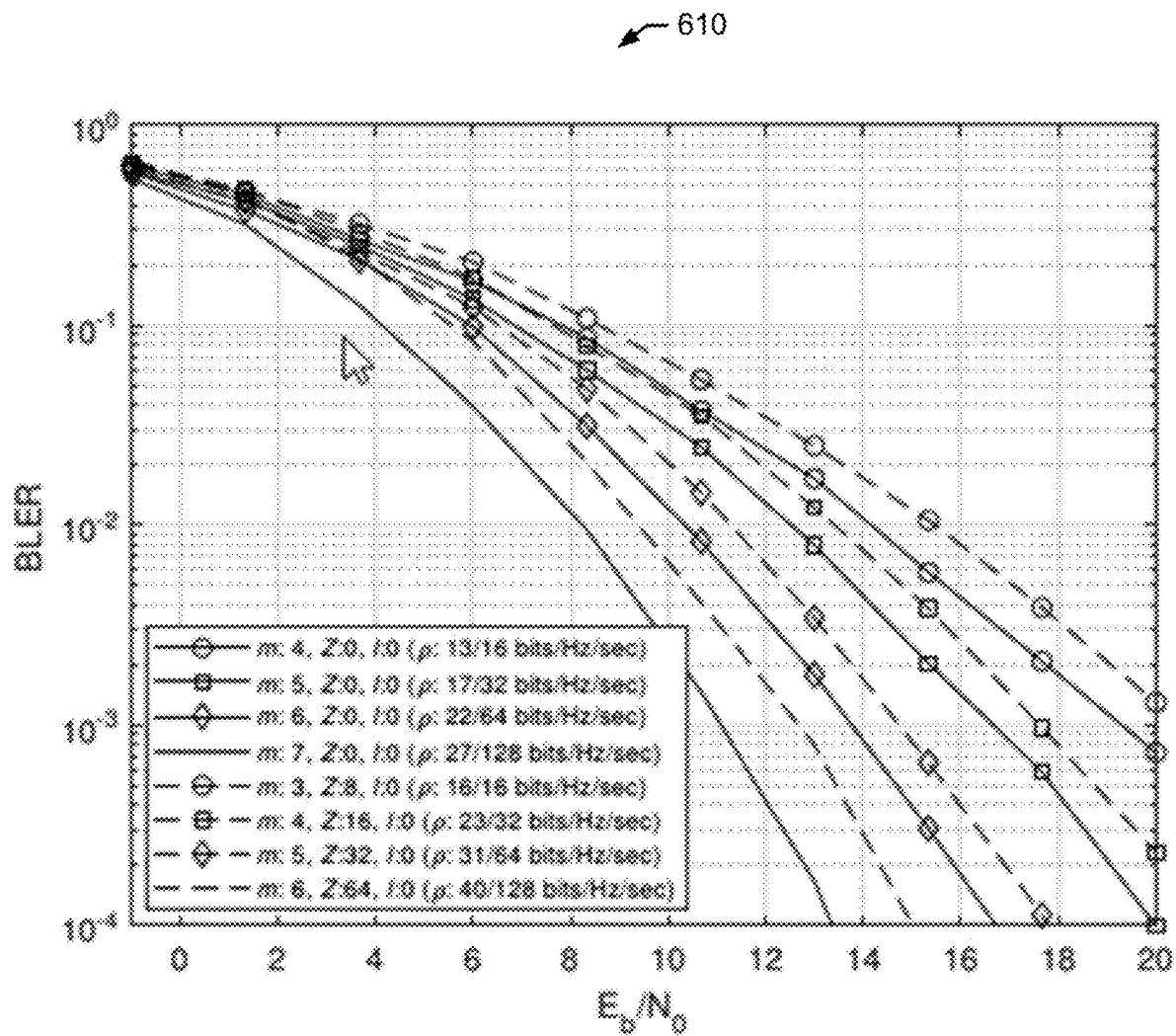
Figure 6C:
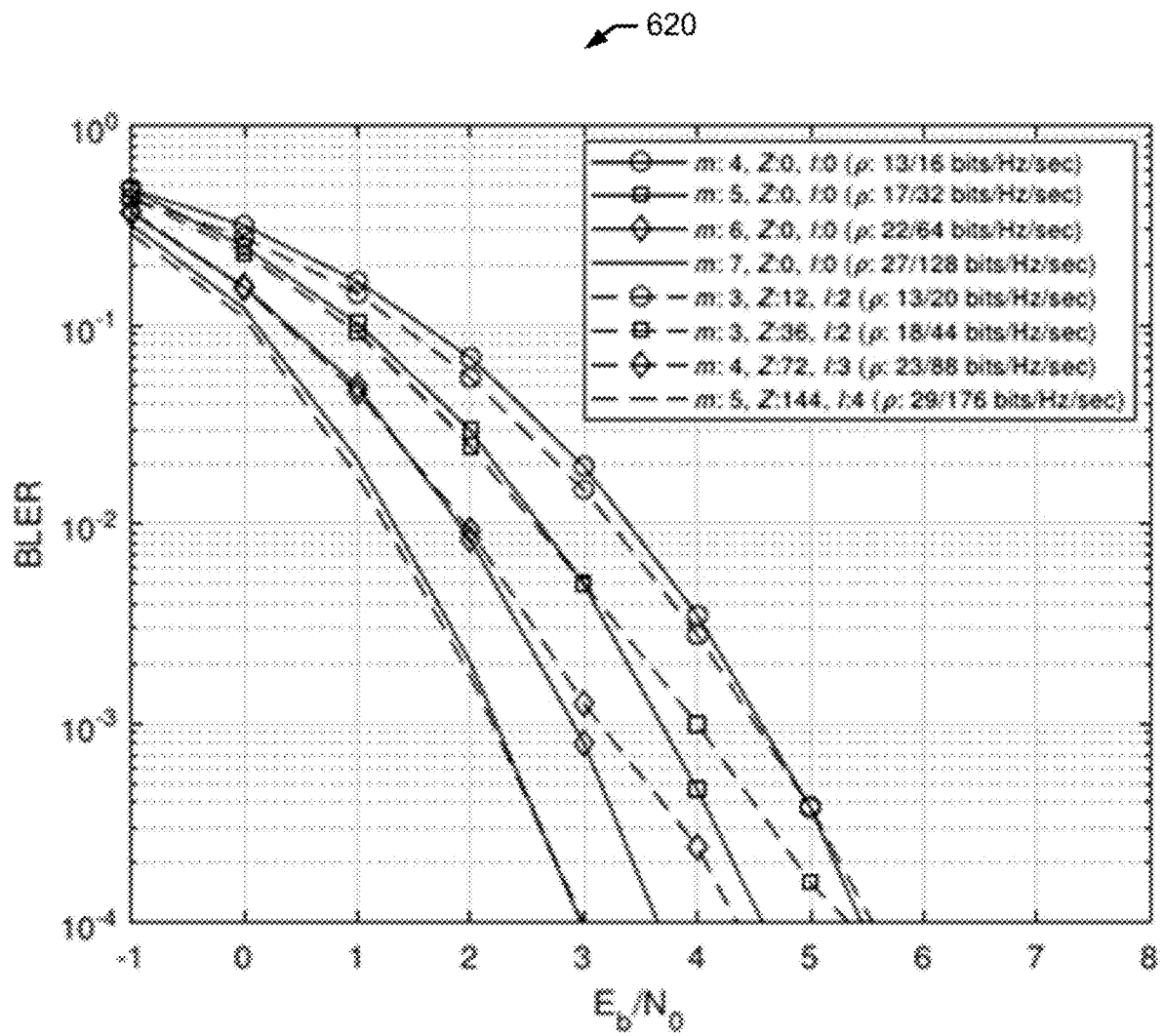
Figure 6D:
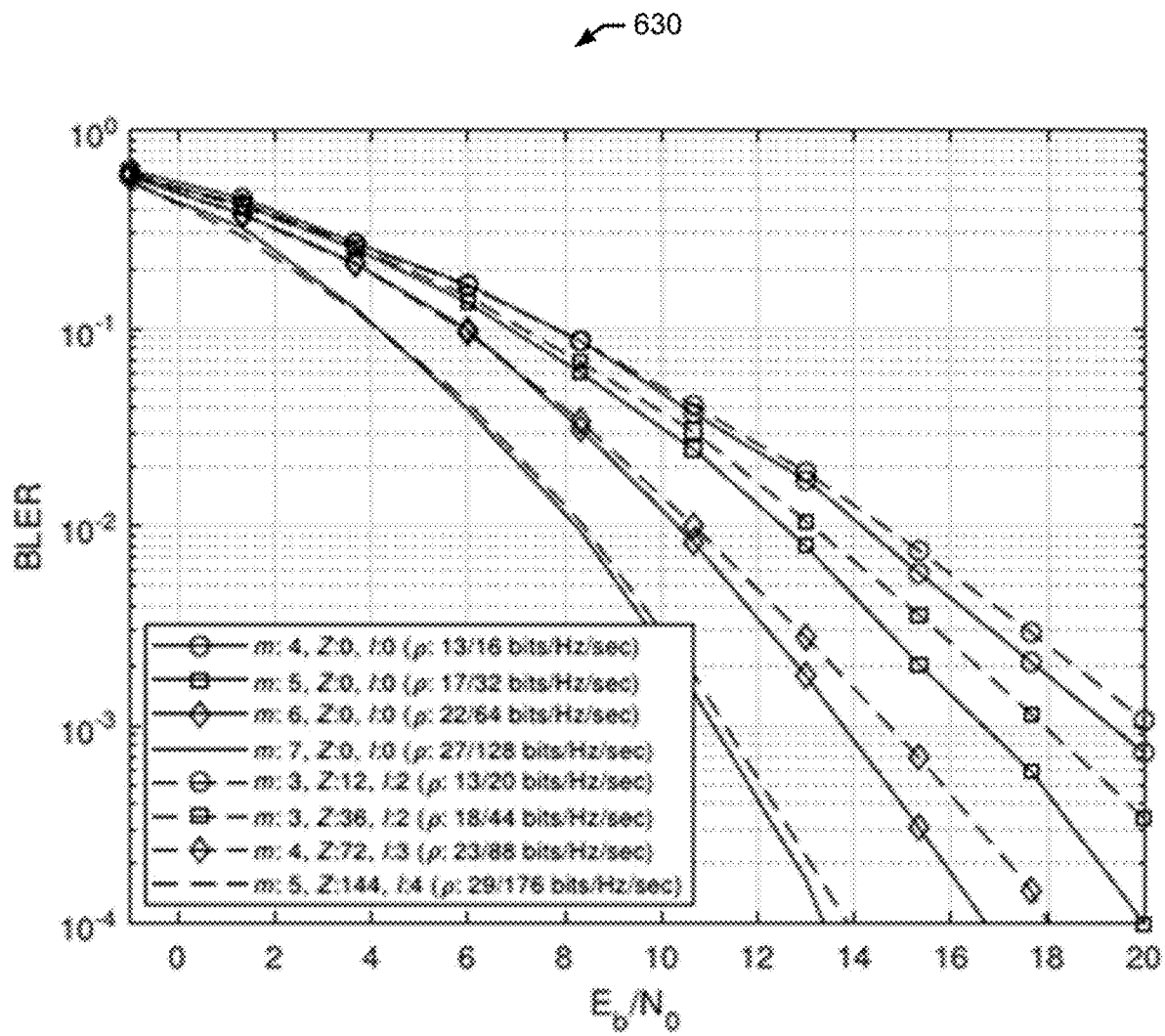

FIGS. 6A-6D show graphs 600, 610, 620, and 630 and BLER performance of partitioned CSs as compared to that of the standard CSs in [5]. In FIGS. 6A-6D, the BLER versus $E_b/N_0$ curves of the aforementioned configurations is provided in AWGN and fading channels. In FIG. 6A and FIG. 6B, the first group is considered where there is no minimum distance constraint. Partitioned CSs with a smaller m under the same bandwidth yields a higher SE as compared to the standard CS. For example, M=128, the number of information bits increases to 40 for m=6 whereas it is 27 bits for the standard CSs with m=6. However, since the partitioning (without any constraint) decreases the minimum Euclidean distance of the standard CSs, the block error rate (BLER) increases for the partitioned CSs. At 1e-3 BLER, the $E_b/N_0$ losses are approximately 1.7, 1.5, 0.9, and 1 dB for M=16, M=32, M=64, and M=128, respectively, for AWGN channel. The gap between the standard CSs and partitioned CSs diminishes at 1e-3 BLER for a large m. However, the slopes of the curves for the standard CSs and the partitioned CSs are different. The case where Z=64 performs worse than the case for Z=32 for low $E_b/N_0$ may be considered. This is due to the sequence identification at the initialization of the decoder and a larger $N_{select}$ needs to be considered for the case Z=64 at the expense of a higher complexity. In the fading channel, the $E_b/N_0$ losses are approximately 1 dB at 1e-3 BLER for all cases. In FIG. 6C and FIG. 6D, the second group is considered where a minimum distance constraint is introduced to the partitioned CSs. Under this constraint, the partitioned CSs perform similar to the standard CSs with a similar SE. For example, for the case (m=5; Z=144; l=4), the SE is 29/176=0.1648 bits/Hz/sec and $d_{min}$=13.27. Hence, it performs similar to the standard CSs, where m=7, and the corresponding SE and $d_{min}$ are 27/128=0.2109 bits/Hz/sec and 11.31, respectively. The similar observations can be made for the cases (m=4; Z=72; l=3), (m=3; Z=36; l=2), and (m=3, Z=12, l=2), where $d_{min}$ can be calculated as 9.38, 6.63, and 4, 47, respectively. Note that $d_{min}$ is 8, 5.69, and 4, for the standard CSs for m=6, m=5, and m=4, respectively. For the fading channel, $E_b/N_0$ loss is less than 1 dB for all cases.

Figure 7:
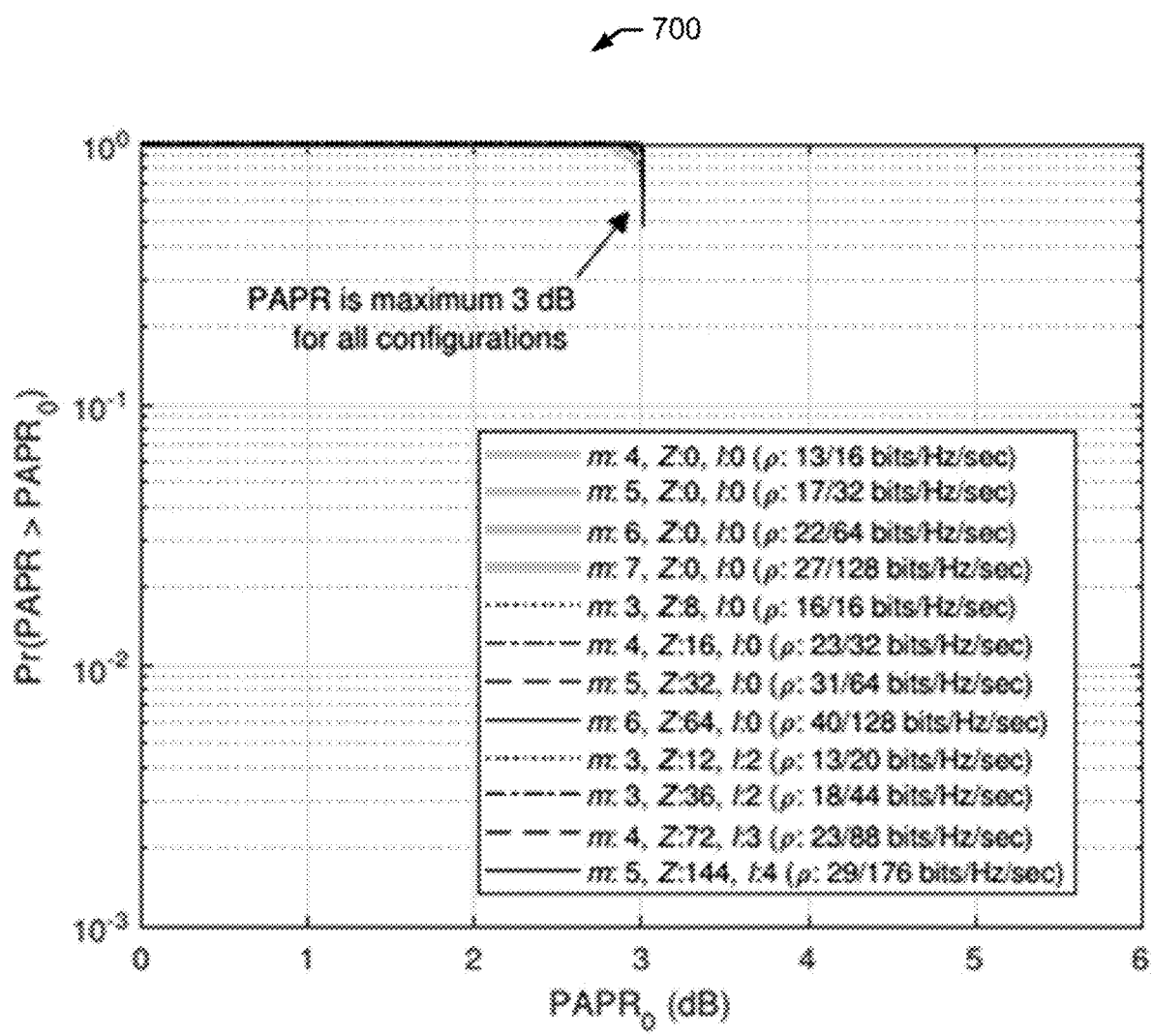
FIG. 7 shows an illustration of a peak-to-average-power ratio distribution according to some example embodiments.
Figure 8:
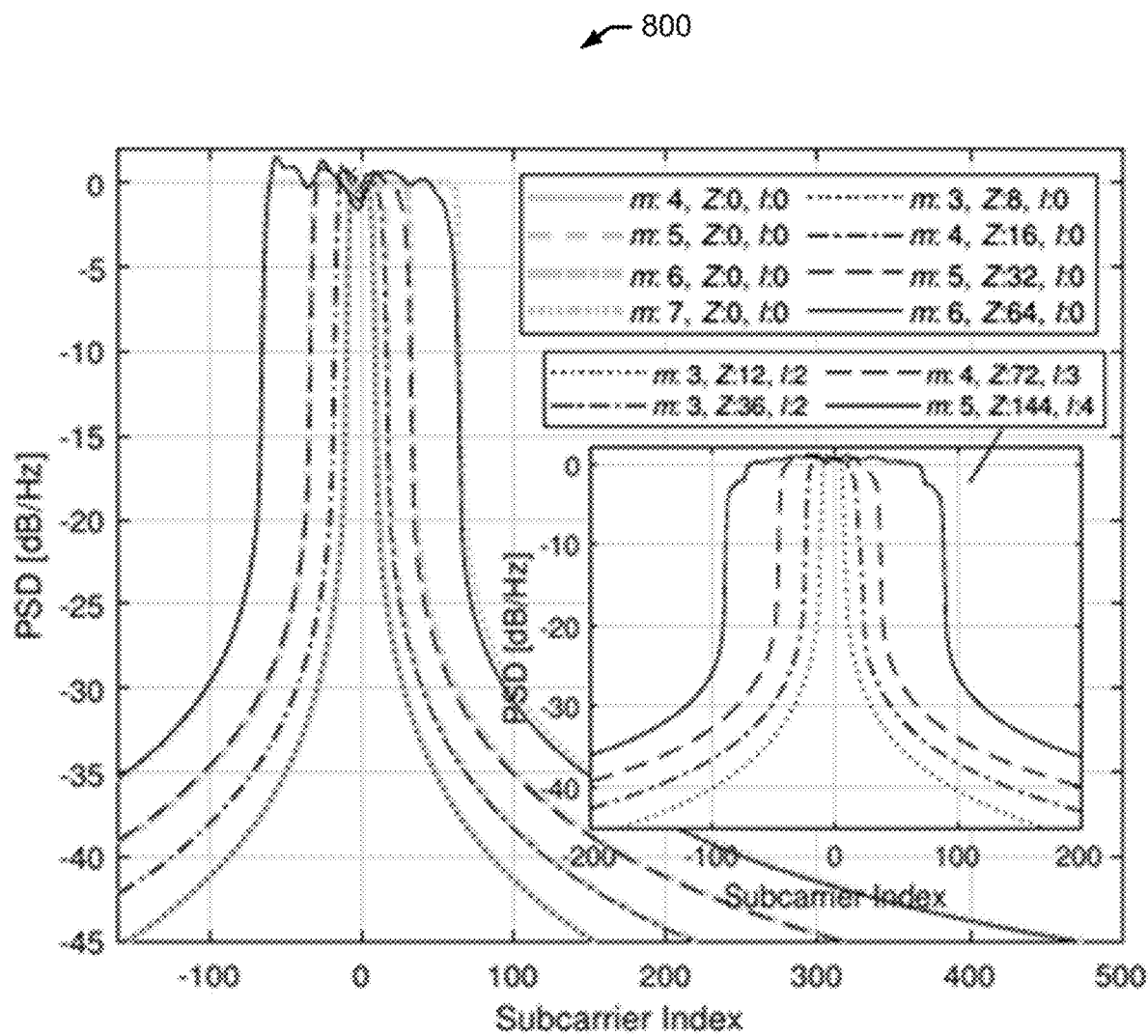
FIG. 8 shows a graph of spectral characteristics according to some example embodiments.

FIG. 7 shows PAPR distribution 700 and FIG. 8 shows spectral characteristics 800. In FIG. 7 and FIG. 8, PAPR distributions and spectrum characteristics are provided for the aforementioned configurations, respectively. As expected, the partitioning maintains the PAPR benefit of the standard CSs as the partitioned sequences based on Theorem 1 are still CSs. Hence, we observe that the maximum PAPR is 3 dB for all configurations. Since partitioning does not alter the sequence energy, the mean OFDM symbol power also remains constant. On the other hand, partitioning alters the spectral characteristics of the transmitted signal. While the side lobes follow the typical OFDM signal characteristics, the main lobe of the transmitted signal is not flat. This is due to the fact that the partitioned CSs utilize the subcarriers non-uniformly. For l=0, the main lobe is also asymmetric with respect to the center of the signal bandwidth. This is because of the asymmetric construction of partitioned CSs as in FIG. 3. The fluctuations in the main lobe are around 2 dB. For l>0, the partitioned CSs are symmetric with respect to the reference points as in FIG. 4. Thus, the corresponding main lobes for the these configurations are symmetric. It is worth noting that the loss of flatness of the main lobe of the transmitted signal is often not a major concern for traditional communication systems as long as the spectrum characteristics are within the range of regulatory limits.

A partitioned CSs for OFDM-based systems is provided. The number of partitioned CSs for given bandwidth and a minimum distance constraint can be determined. The corresponding recursive methods for mapping a natural number to a partition and vice versa are considered. The partitioning rule under Theorem 1 is related to the non-squashing partitions of a positive integer, which also allows the partitions to be restricted based on a minimum distance constraint due to its symmetric nature. In addition, the encoder and an ML-based recursive decoder for partitioned CSs is considered, which may be utilized as a benchmark for low-complexity decoders. A larger number of CSs can be synthesized as compared to the standard CSs for a given bandwidth through partitioning. Hence, partitioning provides a way of achieving a larger SE without changing the alphabet of the non-zero elements of the CS or using a high-order modulation for CSs. Partitioning without any restriction decreases the minimum Euclidean distance of the standard CSs. By using our encoder and detector, the SNR losses are around 2 dB and 1 dB in AWGN and fading channels at 1e-3 BLER, respectively, as compared to the standard CSs. However, under a minimum distance constraint, partitioned CS performs similar to the standard CSs in terms of error rate while providing a flexible sequence length.

Figure 10:
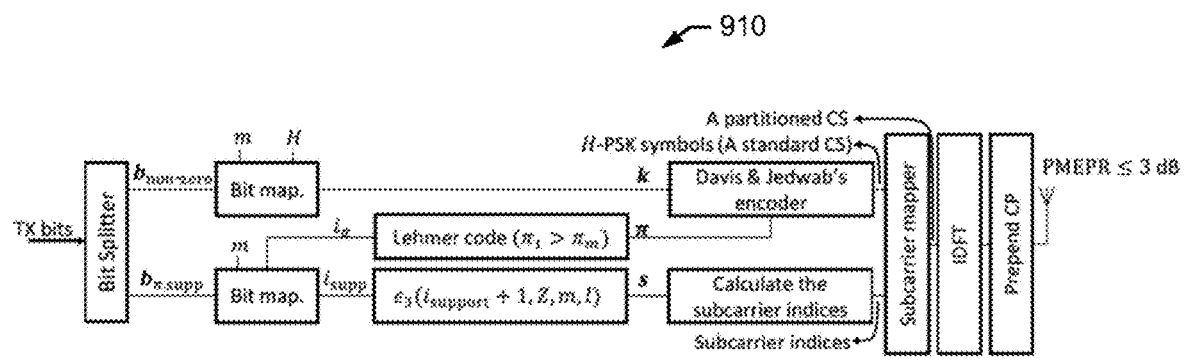
FIG. 10 shows an example transmitter configured to perform encoding as provided herein in accordance with some example embodiments.
Figure 11:
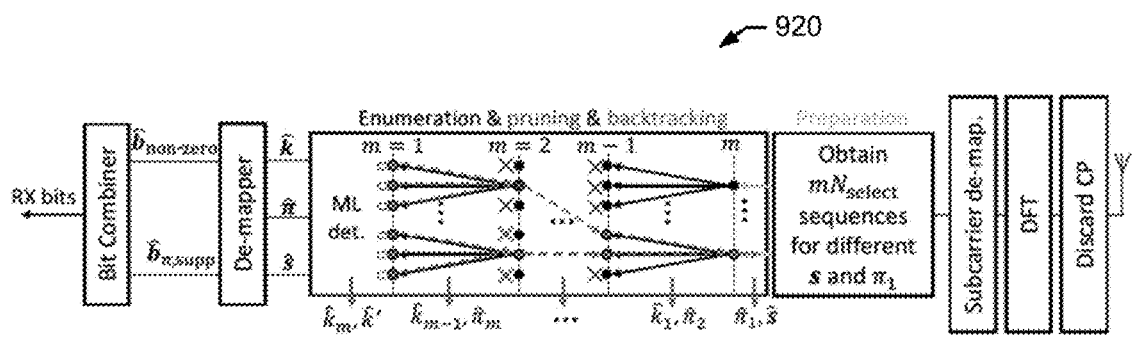
FIG. 11 shows an example receiver configured to perform decoding as provided herein in accordance with some example embodiments.

Based on the foregoing, according to some example embodiments, an encoder and decoder can be defined. In this regard, FIG. 10 illustrates an example transmitter 910 with an encoder configured to perform encoding as provided herein in accordance with some example embodiments. FIG. 11 illustrates an example receiver 920 with an encoder configured to perform decoding as provided herein in accordance with some example embodiments. Additionally, FIG. 12 provides an algorithm 930 that describes the function of a recursive decoder according to some example embodiments.

With respect to the implementation of an encoder according to some example embodiments, information bits may be first split into two bit sequences that are mapped to (k', $k_1$, . . . , $k_m$) and {π, (s', $s_1$, . . . , $s_m$)}, i.e., $b_{non-zero}$ and $b_{\pi,supp}$, respectively. Conversion of $b_{\pi,supp}$ to a decimal number $i_{\pi,supp}$ may then be performed. To obtain π and (s', $s_1$, . . . , $s_m$), decomposition of $i_{\pi,supp}=i_{supp}m!/2+i_\pi$ may be performed such that $i_\pi<m!/2$ for $i_\pi$, $i_{supp} \in \mathbb{Z}_0^+$. Factoradic may be then be utilized based on Lehmer code (See D. Lehmer, "Teaching combinatorial tricks to a computer," in Proc. Sympos. Appl. Math. Combinatorial Analysis Amer. Math. Soc., vol. 10, 1960, pp. 179-193) to obtain π from $i_\pi$. To avoid using π and its reversed version, assume that $\pi_1 > \pi_m$. Then obtain (s', $s_1$, . . . , $s_m$) with $\epsilon_3(i_{supp}+1, Z, m, l)$ and control the minimum Euclidian distance for the partitioned CSs with l. For (k', $k_1$, . . . , $k_m$), the bit mapping may be done based on a Gray mapping, e.g., 00→0, 01→1, 10→3, and 11→2 for H=4. After obtaining π, (k', $k_1$, . . . , $k_m$), and (s', $s_1$, . . . , $s_m$), the corresponding baseband OFDM symbol can be calculated as $s_t(t)$ where t is a partitioned CS that encodes the information bits. Accordingly, the transmitter 910 that implements this approach is shown in FIG. 10. The transmitter 910 may map the elements of a standard or partitioned CS to the subcarriers chosen based on $b_{\pi,supp}$.

According to some example embodiments, a receiver with an decoder may also be defined. In this regard, the ith element of the received signal may be expressed as $r_i = c_i t_i + n_i$, where $c_i$ and $n_i$ are the complex fading channel and the noise coefficients, respectively. Assuming that the channel coefficients are available at the receiver, a maximum-likelihood (ML) decoder may correspond to a minimum distance decoder for additive white Gaussian noise (AWGN), i.e., $$\{\theta, s\} = \underset{\{\theta,s\}}{\operatorname{argmin}} \sum_{i=0}^{2^m-1} \left| c_{I_s(i)} \xi^{jf_i(i;\theta)} - r_{I_s(i)} \right|^2 \tag{27}$$

$$= \underset{\{\theta,s\}}{\operatorname{argmin}} \Re\left\{ \sum_{i=0}^{2^m-1} \xi^{-jf_i(i;\theta)} w_{I_s(i)} \right\} - q_s, \tag{28}$$

wherein $$w_{I_s(i)} = c^*_{I_s} r_{I_s(i)}, \quad q_s = \sum_{k=0}^{2^m-1} h_{I_s(i)}$$

is the channel quality information, $h_{I_s(i)} = |c_{I_s(i)}|^2/2$, $\theta = \{\pi, k', k_1, \ldots, k_m\}$, s=(s', $s_1$, . . . , $s_m$), and $I_s(i) = i + f_i(i)$.

To solve (28), consider the principle discussed in Lehmer and modify it by introducing simplifications due to the PSK alphabet for the non-zero elements of the partitioned CSs. As done in Lehmer, first decompose $f_i(x;\theta)$ as $f_i(x;\theta) = g_i^l(x^l;\psi) + x_l f_i^l(x^l;\phi)$ for l={1, 2, . . . , m}, where $$x^l \triangleq (x_1, x_2, \ldots, x_{l-1}, x_{l+1}, \ldots, x_m) \text{ and } f_i^l(x^l) \triangleq \frac{\partial f(x)}{\partial x_l}.$$

By using this decomposition, the objective function (28) can be re-written as $$\max_{\{\psi,\phi,s\}} \Re\left\{ \sum_{i=0}^{2^{m-1}-1} \xi^{-jg_i^l(x;\psi)} w_{i,l}^l \right\} - q_s, \text{ where} \tag{29}$$

$$w_i^l = w_{I_s(M_l(i))} + w_{I_s(M_l(i)+2^{m-l})} \xi^{-jf_i^l(i;\phi)}, \tag{30}$$

and $M_l(i)$ maps the integers between 0 and $2^{m-1}-1$ to the values of $\Sigma_{j-1}^m x_j 2^{m-j}$ in ascending order for $x_l=0$. For $\pi_1=1$, $f_i^l(x^l)$ can be calculated as $$k_1 + \frac{H}{2} x_{\pi_2},$$

which leads tow φ={$k_1$, $\pi_2$} for a given l. For a hypothesized s, $k_1$, $\pi_2$, and l, finding ψ that solves (29) is equivalent to the problem (28), but the length of the sequence $(w_i^l)_{i=0}^{2^{m-1}-1}$ is $2^{m-1}$. Hence, by repeating the same procedure, a recursive ML decoder can be obtained. A bottleneck of this approach can be the exponential growth of the enumerated parameters.

To address this issue, the unpromising branches may be terminated early as done in Lehman. As compared to Lehman, the algorithm may be run for the promising values for the sequence s in parallel. The decoder can be simplified by removing steps that are related to high-order constellations. The complexity may be reduced at the backtracking stage while considering unimodular non-zero elements.

The decoder can be described in the following fives stages, beginning with the preparation stage. First choose the most likely $N_{select} = \min\{B^{(m,l)}(Z), N_{max}\}$ separations based on the metric given by $$\sum_{i=0}^{2^m-1} \max_{c_i \in \mathbb{Z}_H} (\Re\{\xi^{-jc_i} w_i\}) - q_i, \quad (31)$$

i.e., a high signal-to-noise ratio (SNR) estimation of (28), where $N_{max}$ is the maximum number of separations that are considered in the decoding procedure. Since the receiver does not know $\pi_1 \in \{1, 2, \ldots m\}$ in advance, the selected sequences may be repeated m times and populate them in $W_m$, which leads to $N=mN_{select}$ sequences. The corresponding channel quality information and the hypothesized $\pi_1$ are listed in $q_m$ and $l_m$, respectively.

In a second stage, enumeration may be performed. In this regard, the decoder enumerates $(w_i^l)_{i=0}^{2^{m-1}-1}$ based on (30) for m−1 and H options for $\pi_2$ and $k_1$, respectively. It then populates the resulting sequences in $W_{m-1}$. It also keeps the channel quality information and chosen $\pi_2$ in $q_{m-1}$ and $l_{m-1}$, respectively.

In a third stage, pruning is performed. To avoid exponential growth, the decoder prunes $W_{m-1}$ (and the corresponding elements of $q_{m-1}$ and $l_{m-1}$). To this end, it calculates the score given by $$\sum_{i=0}^{2^{m-1}-1} \max_{c_i \in \mathbb{Z}_H} (\Re\{\xi^{-jc_i} w_i'\}) - q_i, \quad (32)$$

for $w'_i \in W_{m-1}$. The detector then chooses $N_{best}$ sequences based on the score and terminates others. For backtracking, it also lists the indices of the chosen sequences in $n_{m-1}$. It then calls itself. It repeats the enumeration and pruning stages till it reaches to m=1.

In a fourth stage, backtracking may be performed. For m=1, the decoder performs ML detection for the sequences in $W_{m-1}$ and finds the $\hat{n}_m$th sequence in $W_{m-1}$ that maximizes the likelihood. It then returns the sequence index $\hat{n}_m$ and the detected parameters $\hat{k}_1$, $\hat{k}'$, and $\hat{\pi}=(1)$. For m≥2, the decoder first identifies the chosen sequence by using $n_{m-1}$ and the provided index from the preceding step, i.e., $\hat{n}_{m-1}$. It then calculates $\hat{k}_1$ and $\hat{\pi}_1$ by using $l_{m-1}$ and $\hat{n}_{m-1}$ and combines them with the detected permutation and the phases from the preceding step.

In a fifth stage, de-mapping may be performed. After backtracking is finalized, the detected $\hat{s}$ can be obtained from $\hat{n}_m$. The parameter $\hat{i}_{supp}$ can then be calculated as $\hat{i}_{supp} = \epsilon_3^{-1}(\hat{s}, Z, M, 1) - 1$. Therefore, $\hat{i}_{\pi,supp}$ can be obtained as $\hat{i}_{\pi,supp} = \hat{i}_{supp} m!/2 + \hat{i}_\pi$, where $\hat{i}_\pi$ is the corresponding integer for $\hat{\pi}$. It is worth noting that if the detected $\hat{\pi}_1$ is less than the detected $\hat{\pi}_m$, the detector reverses the elements of $\hat{\pi}$ and the detected $(\hat{k}_1, \ldots, \hat{k}_m)$. Finally, the decoder converts the decimal $\hat{i}_{\pi,supp}$ and the sequence $(\hat{k}_1, \ldots, \hat{k}_m, \hat{k}')$ to $\hat{b}_{non-zero}$, respectively. Pseudocode for the decoder is given in Algorithm 2 in FIG. 12 as provided at 930. Additionally, the receiver 920 is also shown in FIG. 11.

Figure 13:
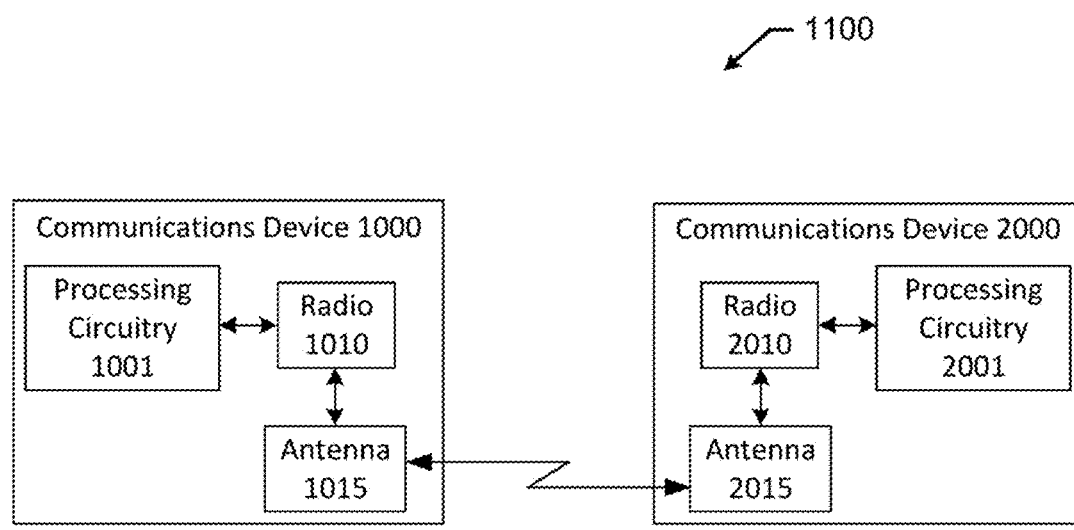
FIG. 13 shows a communications system according to some example embodiments.

In view of the solutions relating to partitioned CSs described above and otherwise herein, example embodiments may be implemented in the context of a communications system 1100 as shown in FIG. 13. The communications system 1100 may include a complex system of intermediate devices that support communications between communications device 1000 and communications device 2000 to form a communications link 1050, or the communications device 1000 and communications device 2000 may have a direct communications link formed as link 1050, as shown in FIG. 13. In either case, the communications devices 1000 and 2000 may be configured to support wireless communications where encoding and decoding are performed in accordance with partitioned complementary sequences as described herein.

In this regard, the system 1100 may include any number of communications devices, including communications devices 1000 and 2000. Although not shown, the communications devices or terminals may be physically coupled to a stationary unit (e.g., a base station or the like) or a mobile unit (e.g., a mobile terminal such as a cellular phone, a vehicle such as an aerial vehicle, a smart device with IoT capabilities, or the like).

The communications device 1000 may comprise, among other components, processing circuitry 1001, radio 1010, and an antenna 1015. As further described below, the processing circuitry 1001 may be configured to control the radio 1010 to transmit and receive wireless communications via the antenna 1015. In the regard, a communications link 1050 which may include a wireless component may be established between the antenna 1015 and the antenna 2015 of the communications device 2000. Similarly, the communications device 2000 may comprise, among other components, processing circuitry 2001, radio 2010, and the antenna 2015. The processing circuitry 2001 may be configured the same or similar to the processing 1001, and thus maybe configured to control the radio 2010 to transmit and receive wireless communications via the antenna 2015. As further described below, the configuration of the communications device 2000 may be the same or similar to the configuration of the communications device 1000 to support communications involving partitioned complementary sequences as described herein.

Figure 14:
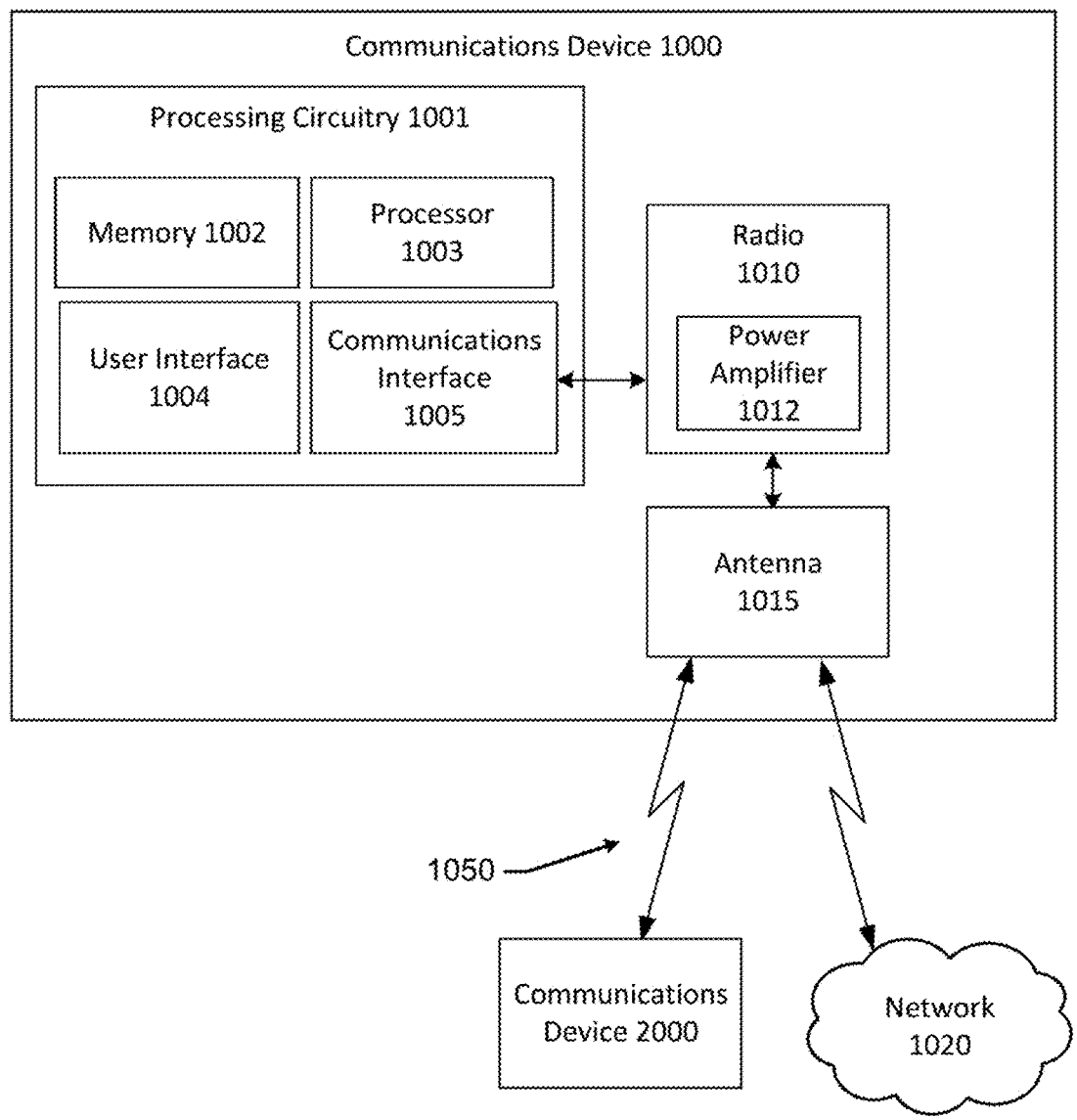
FIG. 14 shows a communications device according to some example embodiments.

In this regard, FIG. 14 shows a more detailed version of the communications device 1000, and, in particular, the processing circuitry 1001. Again, shown in FIG. 14, the communications device 1000 may comprise the processing circuitry 1001, the radio 1010, and the antenna 1015. However, the link 1050 is shown as being a communications link to communications device 2000, or as a communications link to the network 1020, which may be any type of wired or wireless communications network.

The processing circuity 1001 may be configured to receive inputs and provide outputs in association with the various functionalities of the communications device 1000. In this regard, the processing circuitry 1001 may comprise, for example, a memory 1002, a processor 1003, a user interface 1004, and a communications interface 1005. The processing circuitry 1001 may be operably coupled to other components of the communications device 1000 or other components of a device that comprises the communications device 1000.

Further, according to some example embodiments, processing circuitry 1001 may be in operative communication with or embody, the memory 1002, the processor 1003, the user interface 1004, and the communications interface 1005. Through configuration and operation of the memory 1002, the processor 1003, the user interface 1004, and the communications interface 1005, the processing circuitry 1001 may be configurable to perform various operations as described herein. In this regard, the processing circuitry 1001 may be configured to perform computational processing, memory management, user interface control and monitoring, and manage remote communications, signal development and generation, according to an example embodiment. In some embodiments, the processing circuitry 1001 may be embodied as a chip or chip set. In other words, the processing circuitry 1001 may comprise one or more physical packages (e.g., chips) including materials, components or wires on a structural assembly (e.g., a baseboard). The processing circuitry 1001 may be configured to receive inputs (e.g., via peripheral components), perform actions based on the inputs, and generate outputs (e.g., for provision to peripheral components). In an example embodiment, the processing circuitry 1001 may include one or more instances of a processor 1003, associated circuitry, and memory 1002. As such, the processing circuitry 1001 may be embodied as a circuit chip (e.g., an integrated circuit chip, such as a field programmable gate array (FPGA)) configured (e.g., with hardware, software or a combination of hardware and software) to perform operations described herein.

In an example embodiment, the memory 1002 may include one or more non-transitory memory devices such as, for example, volatile or non-volatile memory that may be either fixed or removable. The memory 1002 may be configured to store information, data, applications, instructions or the like for enabling, for example, the functionalities described with respect to partitioned complementary sequences. The memory 1002 may operate to buffer instructions and data during operation of the processing circuitry 1001 to support higher-level functionalities, and may also be configured to store instructions for execution by the processing circuitry 1001. The memory 1002 may also store signaling schemes and techniques as described herein. According to some example embodiments, such data may be generated based on other data and stored or the data may be retrieved via the communications interface 1005 and stored.

As mentioned above, the processing circuitry 1001 may be embodied in a number of different ways. For example, the processing circuitry 1001 may be embodied as various processing means such as one or more processors 1003 that may be in the form of a microprocessor or other processing element, a coprocessor, a controller or various other computing or processing devices including integrated circuits such as, for example, an ASIC (application specific integrated circuit), an FPGA, or the like. In an example embodiment, the processing circuitry 1001 may be configured to execute instructions stored in the memory 1002 or otherwise accessible to the processing circuitry 1001. As such, whether configured by hardware or by a combination of hardware and software, the processing circuitry 1001 may represent an entity (e.g., physically embodied in circuitry—in the form of processing circuitry 1001) capable of performing operations according to example embodiments while configured accordingly. Thus, for example, when the processing circuitry 1001 is embodied as an ASIC, FPGA, or the like, the processing circuitry 1001 may be specifically configured hardware for conducting the operations described herein. Alternatively, as another example, when the processing circuitry 1001 is embodied as an executor of software instructions, the instructions may specifically configure the processing circuitry 1001 to perform the operations described herein.

The communication interface 1005 may include one or more interface mechanisms for enabling communication by controlling the radio 1010 to generate the communications link 1050. In some cases, the communication interface 1005 may be any means such as a device or circuitry embodied in either hardware, or a combination of hardware and software that is configured to receive or transmit data from/to devices in communication with the processing circuitry 1001. The communications interface 1005 may support wireless communications via the radio 110 using various communications protocols (802.11 WIFI, Bluetooth, cellular, WLAN, 3GPP NR, 4G, LTE, 5G, and the like or the like).

The user interface 1004 may be controlled by the processing circuitry 1001 to interact with peripheral devices that can receive inputs from a user or provide outputs to a user. In this regard, via the user interface 1004, the processing circuitry 1001 may be configured to provide control and output signals to a peripheral device such as, for example, a keyboard, a display (e.g., a touch screen display), mouse, microphone, speaker, or the like. The user interface 1004 may also produce outputs, for example, as visual outputs on a display, audio outputs via a speaker, or the like.

The radio 1010 may be any type of physical radio comprising radio components. For example, the radio 1010 may include components such as a power amplifier 1012, mixer, local oscillator, modulator/demodulator, and the like. The components of the radio 1010 may be configured to operate in a plurality of spectral bands to support communications based on partitioned complementary sequences as described herein. Further, the radio 1010 may be configured to receive signals from the processing circuitry 1001 for transmission to the antenna 1015. In some example embodiments, the radio 1010 may be a software-defined radio or a hybrid software/hardware-defined radio.

The antenna 1015 may be any type of wireless communications antenna. The antenna 1015 may be a configured to be controlled to transmit and receive at more than one frequency or band. In this regard, according to some example embodiments, the antenna 1015 may be an array of antennas that may be configured by the radio 1015 to support various types of wireless communications as described herein.

Having described aspects of the components of communications system 1110, the following describes the implementation of communications involving partitioned complementary sequences via specific configurations of the processing circuitry 1001 to control the radio 1010 and the antenna 1015. In this regard, processing circuity 1001 may be configured to control the radio 1010 to establish a wireless communications link 1050 with a receiving communications device 2000. The processing circuitry 1001 may be configured to generate a partitioned complementary sequence based on information bits for transmission. The partitioned complementary sequence may comprise zero-valued elements. The processing circuitry 1001 may be further configured to encode a plurality of symbols on a plurality of orthogonal subcarriers using the partitioned complementary sequence. In this regard, the processing circuitry may be configured to map additional information bits for encoding on subcarriers associated with the zero-valued elements of the partitioned complementary sequence. Additionally, the processing circuitry 1001 may be configured to control the radio 1010 to transmit the plurality of symbols on the plurality of orthogonal subcarriers via the antenna 1015.

According to some example embodiments, the processing circuitry 1001 may be configured to generate the partitioned complementary sequence by applying a minimum Euclidean distance constraint as a partitioning restriction criterion. Further, the minimum Euclidean distance constraint may be based on a selected spectral efficiency range and a selected bandwidth. Additionally or alternatively, the partitioned complementary sequence is defined for a selected bandwidth. Additionally or alternatively, according to some example embodiments, the plurality of symbols may be orthogonal frequency division multiplexed (OFDM) symbols. Additionally or alternatively, according to some example embodiments, the processing circuitry 1001 may be configured to encode the plurality of symbols on the plurality of orthogonal subcarriers using the partitioned complementary sequence to have a peak-to-average-power ratio (PAPR) that is below a predefined threshold level. Additionally or alternatively, according to some example embodiments, the processing circuitry 1001 may be configured to encode the plurality of symbols using an alphabet for non-zero elements of the partitioned complementary sequence based on a phase shift keying alphabet. Additionally or alternatively, according to some example embodiments, the processing circuitry 1001 may be further configured to activate and deactivate one or more of the subcarriers based on index modulation. Additionally or alternatively, according to some example embodiments, the processing circuitry 1001 may be configured to implement an encoder and decoder based on the partitioned complementary sequence. Additionally or alternatively, according to some example embodiments, the processing circuitry 1001 may be configured to generate the partitioned complementary sequence having non-squashing partitions.

Figure 15:
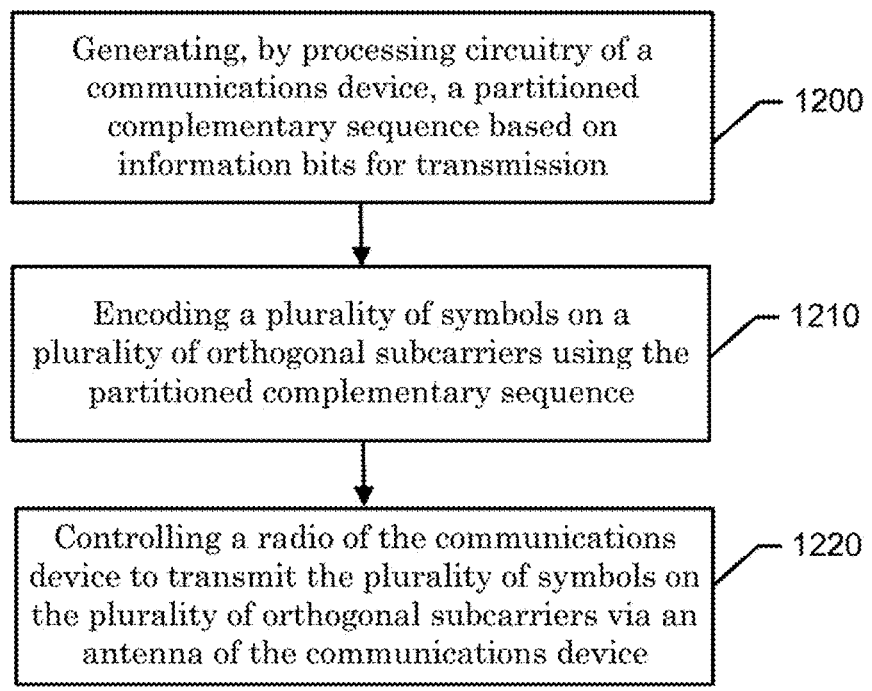
FIG. 15 shows a block diagram of a method for implementing communications in accordance with partitioned complementary sequences according to some example embodiments.

Additionally, example methods are provided in accordance with various example embodiments. In this regard, with reference to FIG. 15, an example method for implementing communications based on a partitioned complementary sequence as described herein is provided. In this regard, the example method may comprise, at 1200, generating, by processing circuitry of a communications device, a partitioned complementary sequence based on information bits for transmission. In this regard, the partitioned complementary sequence may comprises zero-valued elements. The example method may further comprise, at 1210, encoding a plurality of symbols on a plurality of orthogonal subcarriers using the partitioned complementary sequence. In this regard, the encoding may comprise mapping additional information bits on subcarriers associated with the zero-valued elements of the partitioned complementary sequence. Also, the example method may comprise, at 1220, controlling a radio of the communications device to transmit the plurality of symbols on the plurality of orthogonal subcarriers via an antenna of the communications device.

Additionally, according to some example embodiments, generating the partitioned complementary sequence may further comprise applying a minimum Euclidean distance constraint as a partitioning restriction criterion. Additionally, according to some example embodiments, the minimum Euclidean distance constraint may be based on a selected spectral efficiency range and a selected bandwidth. Additionally or alternatively, according to some example embodiments, the partitioned complementary sequence may be defined for a selected bandwidth. Additionally or alternatively, according to some example embodiments, the plurality of symbols may be orthogonal frequency division multiplexed (OFDM) symbols. Additionally or alternatively, according to some example embodiments, encoding the plurality of symbols on the plurality of orthogonal subcarriers may comprise using the partitioned complementary sequence to have a peak-to-average-power ratio (PAPR) that is below a predefined threshold level. Additionally or alternatively, according to some example embodiments, the plurality of symbols may be encoded using an alphabet for non-zero elements of the partitioned complementary sequence based on a phase shift keying alphabet. Additionally or alternatively, according to some example embodiments, the example method may further comprise activating and deactivating one or more of the subcarriers based on index modulation. Additionally or alternatively, according to some example embodiments, the example method may further comprise implementing an encoder and decoder based on the partitioned complementary sequence. Additionally or alternatively, according to some example embodiments, the partitioned complementary sequence may be generated with non-squashing partitions.

Various modifications and variations of the described methods, apparatuses, and systems will be apparent to those skilled in the art without departing from the scope and spirit of the disclosure. Although the example embodiments have been described in connection with specific embodiments, it will be understood that it is capable of further modifications and that the example embodiments as claimed should not be unduly limited to such specific embodiments. Indeed, various modifications of the described modes for carrying out the example embodiments that are obvious to those skilled in the art are intended to be within the scope of the disclosure. This application is intended to cover any variations, uses, or adaptations of the example embodiments following, in general, the principles of the example embodiments and including such departures from the present example embodiments come within known customary practice within the art to which the example embodiments pertain and may be applied to the essential features herein before set forth.

What is claimed is:
1. An apparatus comprising:
   an antenna;
   a radio configured to transmit and receive wireless communications via the antenna; and
   processing circuitry configured to control the radio to establish a wireless communications link with a receiving communications device;
   wherein the processing circuitry is further configured to:
      generate a partitioned complementary sequence based on information bits for transmission, the partitioned complementary sequence comprising zero-valued elements;
      encode a plurality of symbols on a plurality of orthogonal subcarriers using the partitioned complementary sequence, wherein the processing circuitry is configured to map additional information bits for encoding on subcarriers associated with the zero-valued elements of the partitioned complementary sequence; and
      control the radio to transmit the plurality of symbols on the plurality of orthogonal subcarriers via the antenna.
2. The apparatus of claim 1, wherein the processing circuitry configured to generate the partitioned complemen- tary sequence is further configured to apply a minimum Euclidean distance constraint as a partitioning restriction criterion.

3. The apparatus of claim 2, wherein the minimum Euclidean distance constraint is based on a selected spectral efficiency range and a selected bandwidth.

4. The apparatus of claim 1, wherein the partitioned complementary sequence is defined for a selected bandwidth.

5. The apparatus of claim 1, wherein the plurality of symbols are orthogonal frequency division multiplexed (OFDM) symbols.

6. The apparatus of claim 1, wherein the processing circuitry is configured to encode the plurality of symbols on the plurality of orthogonal subcarriers using the partitioned complementary sequence to have a peak-to-average-power ratio (PAPR) that is below a predefined threshold level.

7. The apparatus of claim 1, wherein the processing circuitry is configured to encode the plurality of symbols using an alphabet for non-zero elements of the partitioned complementary sequence based on a phase shift keying alphabet.

8. The apparatus of claim 1, wherein the processing circuitry is further configured to activate and deactivate one or more of the subcarriers based on index modulation.

9. The apparatus of claim 1, wherein the processing circuitry is configured to implement an encoder and decoder based on the partitioned complementary sequence.

10. The apparatus of claim 1, wherein the processing circuitry is configured to generate the partitioned complementary sequence having non-squashing partitions.

11. A method comprising:
generating, by processing circuitry of a communications device, a partitioned complementary sequence based on information bits for transmission, the partitioned complementary sequence comprising zero-valued elements;
encoding a plurality of symbols on a plurality of orthogonal subcarriers using the partitioned complementary sequence, wherein the encoding comprises mapping additional information bits on subcarriers associated with the zero-valued elements of the partitioned complementary sequence; and
controlling a radio of the communications device to transmit the plurality of symbols on the plurality of orthogonal subcarriers via an antenna of the communications device.

12. The method of claim 11, wherein generating the partitioned complementary sequence further comprises applying a minimum Euclidean distance constraint as a partitioning restriction criterion.

13. The method of claim 12, wherein the minimum Euclidean distance constraint is based on a selected spectral efficiency range and a selected bandwidth.

14. The method of claim 11, wherein the partitioned complementary sequence is defined for a selected bandwidth.

15. The method of claim 11, wherein the plurality of symbols are orthogonal frequency division multiplexed (OFDM) symbols.

16. The method of claim 11, wherein encoding the plurality of symbols on the plurality of orthogonal subcarriers comprises using the partitioned complementary sequence to have a peak-to-average-power ratio (PAPR) that is below a predefined threshold level.

17. The method of claim 11, wherein the plurality of symbols are encoded using an alphabet for non-zero elements of the partitioned complementary sequence based on a phase shift keying alphabet.

18. The method of claim 11, further comprising activating and deactivating one or more of the subcarriers based on index modulation.

19. The method of claim 11, further comprising implementing an encoder and decoder based on the partitioned complementary sequence.

20. The method of claim 11, wherein the partitioned complementary sequence is generated with non-squashing partitions.

* * * * *